United States Patent
Mailhe et al.

(10) Patent No.: US 10,573,031 B2
(45) Date of Patent: Feb. 25, 2020

(54) MAGNETIC RESONANCE IMAGE RECONSTRUCTION WITH DEEP REINFORCEMENT LEARNING

(71) Applicant: Siemens Healthcare GmbH, Erlangen (DE)

(72) Inventors: Boris Mailhe, Plainsboro, NJ (US); Benjamin L. Odry, West New York, NJ (US); Xiao Chen, Princeton, NJ (US); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 152 days.

(21) Appl. No.: 15/832,967

(22) Filed: Dec. 6, 2017

(65) Prior Publication Data
US 2019/0172230 A1    Jun. 6, 2019

(51) Int. Cl.
| | | |
|---|---|---|
| *G06T 11/00* | (2006.01) | |
| *G06N 3/08* | (2006.01) | |
| *G06N 3/04* | (2006.01) | |
| *G06T 5/00* | (2006.01) | |
| *G06T 5/20* | (2006.01) | |

(52) U.S. Cl.
CPC ......... *G06T 11/008* (2013.01); *G06N 3/0445* (2013.01); *G06N 3/08* (2013.01); *G06T 5/002* (2013.01); *G06T 5/20* (2013.01); *G06T 11/005* (2013.01); *G06T 2207/10088* (2013.01); *G06T 2207/20024* (2013.01); *G06T 2207/20081* (2013.01); *G06T 2207/20084* (2013.01); *G06T 2210/41* (2013.01)

(58) Field of Classification Search
None
See application file for complete search history.

(56) References Cited

U.S. PATENT DOCUMENTS

| | | | |
|---|---|---|---|
| 9,297,873 B2* | 3/2016 | Block | G01R 33/5611 |
| 2013/0121550 A1* | 5/2013 | Chang | G06T 11/003 |
| | | | 382/130 |
| 2015/0077112 A1* | 3/2015 | Otazo | A61B 5/055 |
| | | | 324/318 |

(Continued)

OTHER PUBLICATIONS

Chen, Yunjin, Wei Yu, and Thomas Pock. "On learning optimized reaction diffusion processes for effective image restoration." Proceedings of the IEEE conference on computer vision and pattern recognition. 2015. (Year: 2015).*

(Continued)

*Primary Examiner* — Samah A Beg

(57) ABSTRACT

Deep reinforcement machine learning is used to control denoising (e.g., image regularizer) in iterative reconstruction for MRI compressed sensing. Rather than requiring different machine-learnt networks for different scan settings (e.g., acceleration of the MR compressed sensing), reinforcement learning creates a policy of actions to provide denoising and data fitting through iterations of the reconstruction given a range of different scan settings. This allows a user to scan as appropriate for the patient, the MR system, the application, and/or preferences while still providing an optimized reconstruction under sampling resulting from the MR compressed sensing.

11 Claims, 15 Drawing Sheets

(56) References Cited

U.S. PATENT DOCUMENTS

| | | | | |
|---|---|---|---|---|
| 2015/0323634 A1* | 11/2015 | Polimeni | ......... | G01R 33/56509 |
| | | | | 324/309 |
| 2016/0041247 A1* | 2/2016 | Feiweier | ............... | A61B 5/055 |
| | | | | 324/309 |
| 2018/0203085 A1* | 7/2018 | Traechtler | .......... | G01R 33/5612 |
| 2018/0247436 A1* | 8/2018 | Korobchenko et al. | ..................... | |
| | | | | A61B 5/055 |
| 2018/0285695 A1* | 10/2018 | Guo | ....................... | A61B 5/055 |
| 2019/0154784 A1* | 5/2019 | Polak | ................ | G01R 33/5617 |

OTHER PUBLICATIONS

Hammernik, Kerstin, et al. "Learning a variational network for reconstruction of accelerated MRI data." Magnetic resonance in medicine 79.6 (2018): 3055-3071. (Year: 2018).*

Hollingsworth, Kieren Grant. "Reducing acquisition time in clinical MRI by data undersampling and compressed sensing reconstruction." Physics in Medicine & Biology 60.21 (2015): R297. (Year: 2015).*

Sun, Jian, Huibin Li, and Zongben Xu. "Deep ADMM-Net for compressive sensing MRI." Advances in neural information processing systems. 2016. (Year: 2016).*

U.S. Appl. No. 15/471,079, filed Mar. 28, 2017.

K. Hammernik, F. Knoll, D.K. Sodickson and T. Pock, "Learning a Variational Model for Compressed Sensing MRI Reconstruction", in Proc. ISMRM2016.

* cited by examiner

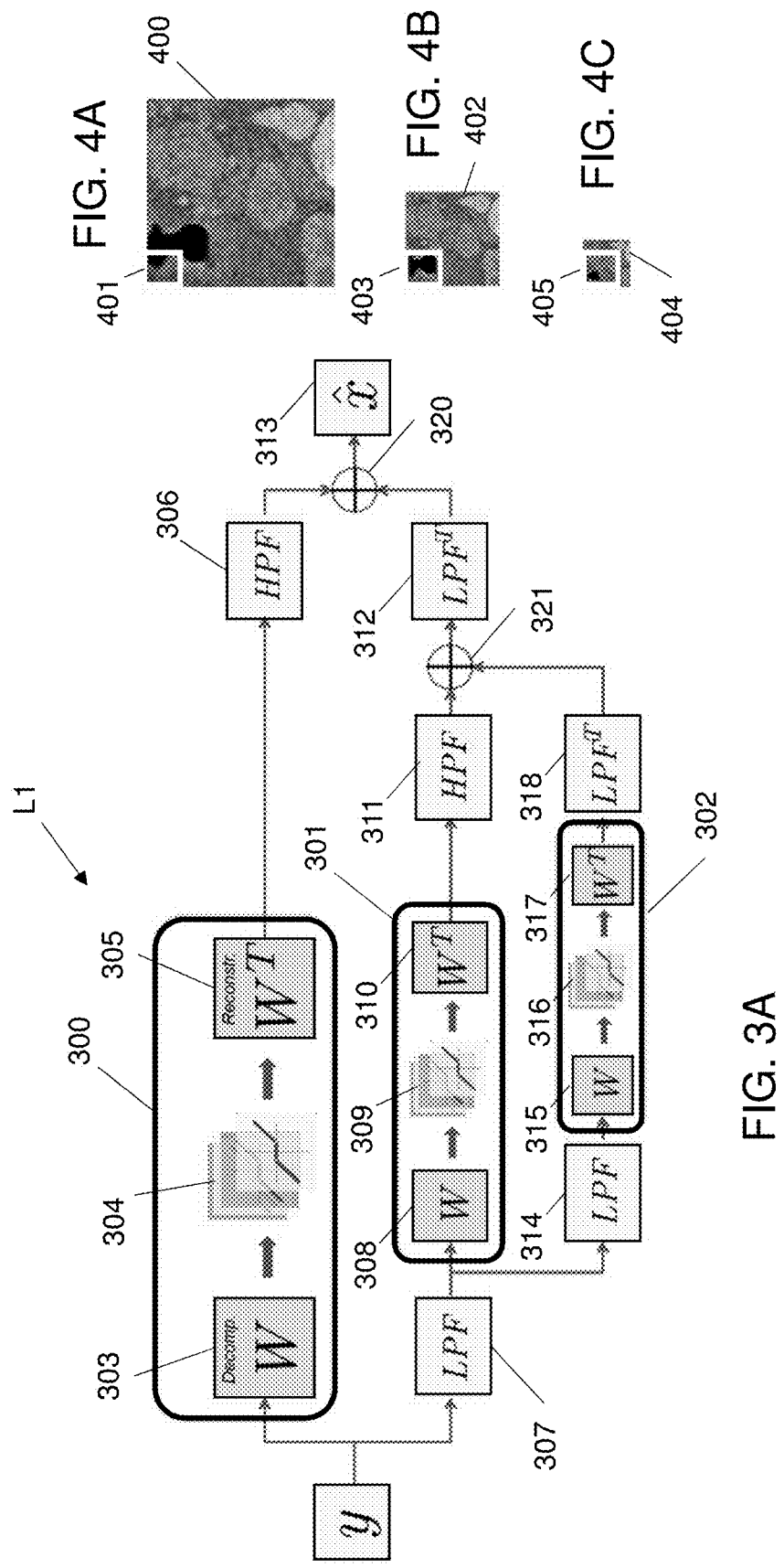

MAGNETIC RESONANCE IMAGE RECONSTRUCTION WITH DEEP REINFORCEMENT LEARNING

FIELD

This disclosure relates to magnetic resonance (MR) imaging generally, and more specifically to MR image reconstruction.

BACKGROUND

Magnetic Resonance Imaging (MRI) is a powerful biomedical tool to non-invasively image the human body for disease diagnosis and healthy physiological process research. MRI is intrinsically slow, and numerous methods have been proposed to accelerate the MRI scan. One of the most important acceleration method is the under-sampling reconstruction technique (i.e., MR compressed sensing), where fewer samples are acquired in the MRI data space (k-space), and prior knowledge is used to restore the images. An image regularizer is used in reconstruction to reduce aliasing artifacts. The MRI image reconstruction problem is often formulated as an optimization problem with constraints, and iterative algorithms, such as non-linear conjugate gradient (NLCG), fast iterated shrinkage/thresholding algorithm (FISTA), alternating direction method of multipliers (ADMM), Broyden-Fletcher-Goldfarb-Shanno (BFGS) quasi-Newton method, or the like, are used to solve the optimization problem.

The amount and shape of aliasing artifacts introduced by the under sampling depend on which measurements are acquired in scanning. Changes in the acquisition sequence require changes in the reconstruction algorithm to deal with the amount and shape of the aliasing artifacts. In the optimization-based reconstruction, parameters of the reconstruction, such as the image regularizer, are manually tuned by the application developer. In data-driven approaches (e.g., machine-learnt reconstruction), the reconstruction is trained to optimize an image for a given sampling pattern. In either approach, a different reconstruction is used for different aliasing artifacts. Users are limited to the sampling patterns for which reconstruction is available or accept poorer reconstruction by using reconstruction not optimized to a desired sampling pattern.

SUMMARY

By way of introduction, the preferred embodiments described below include methods, systems, instructions, and computer readable media for MRI reconstruction. Deep reinforcement machine learning is used to control denoising (e.g., image regularizer) in iterative reconstruction for MRI compressed sensing. Rather than requiring different machine-learnt networks for different scan settings (e.g., acceleration of the MR compressed sensing), reinforcement learning creates a policy of actions to provide denoising and data fitting through iterations of the reconstruction given a range of different scan settings. This allows a user to scan as appropriate for the patient, the MR system, the application, and/or preferences while still providing an optimized reconstruction under sampling resulting from the MR compressed sensing.

In a first aspect, a method is provided for reconstruction of a magnetic resonance (MR) image in an MR system. A user input of a setting of acceleration in an MR compressed sequence is received. The MR system scans a patient with the MR compressed sequence resulting in scan data under-sampled by an amount based on the setting of the acceleration. An image processor iteratively reconstructs the MR image from the scan data. The reconstructing applies a deep reinforcement machine-learnt network trained to control a sequence of actions based on a learned policy through the iterations. The actions are changes in parameters of denoising due to the under-sampled scan data. The MR image is displayed.

In a second aspect, a method is provided for training a network for magnetic resonance (MR) reconstruction from signals collected by an MR scanner. Respective image data is undersampled by varying amounts from each of a plurality of fully-sampled images. Deep reinforcement machine learning learns to reconstruct the MR image from a range of sampling patterns corresponding to the under-sampling. A machine-learnt neural network resulting from the machine learning is stored.

In a third aspect, a system is provided for reconstruction in magnetic resonance (MR) compressed sensing. An MR scanner is configured to scan a patient with the MR compressed sensing. The scan is with a parameter of the MR compressed sensing for the patient being selectable. An image processor is configured to iteratively reconstruct an MR image from the scan with a machine-learnt actor-critic network including a policy for a sequence of actions through iterations of the reconstruction. The actions are for denoising in the reconstruction due to the selectable parameter of the MR compressed sensing. A display is configured to display the MR image.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

FIG. 3A is a block diagram of an exemplary embodiment of a layer of the DNN of FIG. 2.

FIGS. 4A, 4B, and 4C schematically show the input image at each of the three scales in FIG. 3A.

FIG. 8A shows a fully sampled MRI image.

FIGS. 8B, and 8E, 8F, 8G, and 8H show under-sampled images reconstructed by a variety of methods.

FIGS. 8C and 8D show under-sampled images reconstructed using the system of FIGS. 1-3B, before and after training, respectively.

DETAILED DESCRIPTION

Figure 1:
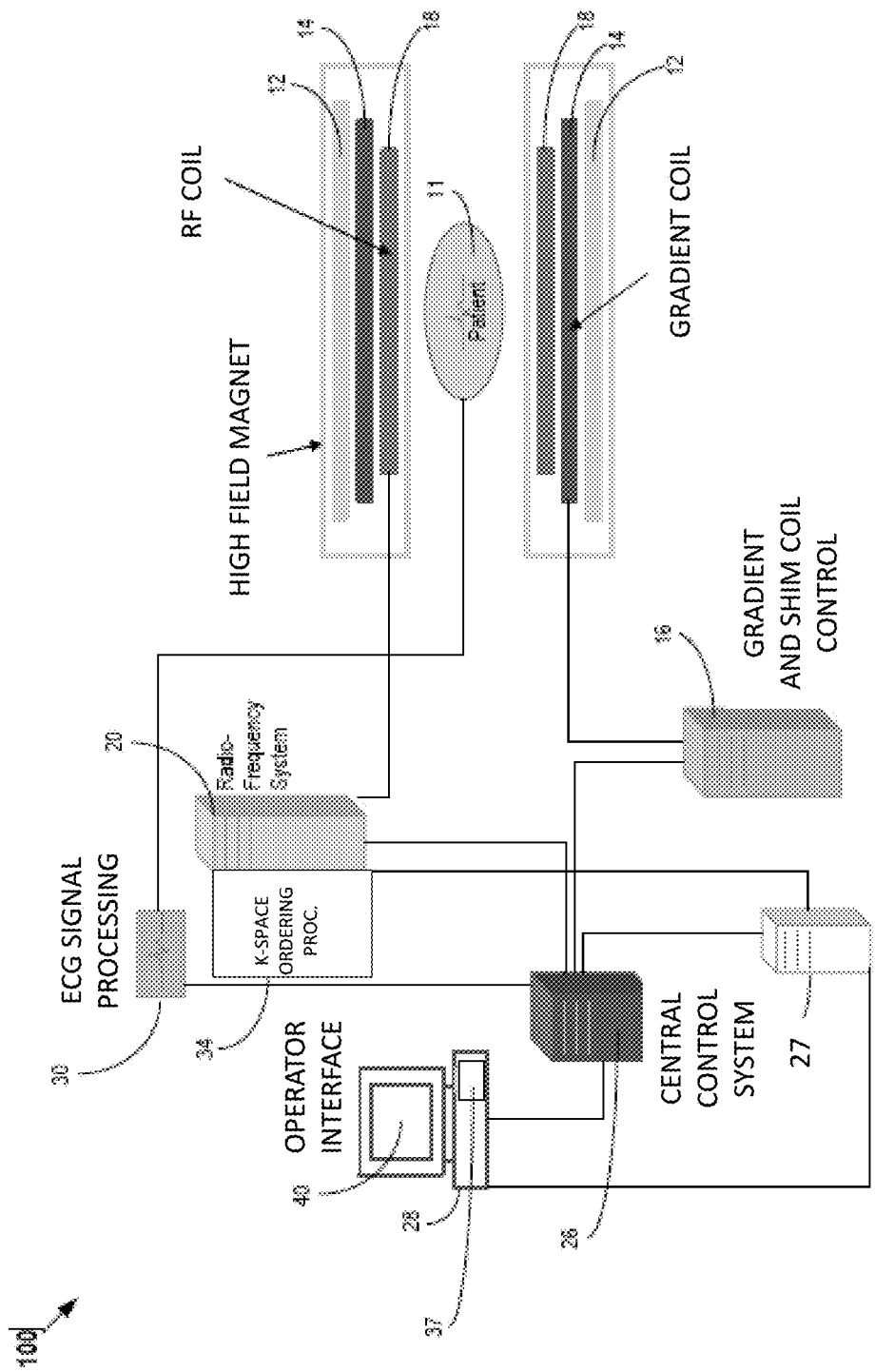
FIG. 1 is a block diagram of an embodiment of an MR system for medical imaging.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Machine learning is used to create a data-driven MR reconstruction for MR compressive sensing. Given a single sample pattern for under sampling, a machine-learnt network is trained to reconstruct with an optimal value for each of any number of reconstruction parameters, such as for denoising. FIGS. 2-8 describe various such embodiments. Such optimal reconstruction provides desired MR images given the under sampling without requiring difficult manual tuning of the reconstruction parameters. However, the operator of the MR system is then required to use the particular sampling pattern for which the machine-learnt network is trained.

In a further development, embodiments are provided for machine learning to reconstruct over a range of reconstruction parameters. Sampling-adaptive data-driven MR reconstruction uses deep reinforcement learning. An Actor-Critic architecture is trained to reconstruct images across a range of sampling patterns with a reduced number of free parameters. The reconstruction process is separated into an actor that performs each iteration of a reconstruction algorithm, such as described in the embodiments of FIGS. 2-8, and a controller that decides a few number of denoising and/or other reconstruction parameters (e.g., scalar thresholds and/ or step sizes) that impact the final MR image. FIGS. 10-15 are directed to this sampling-adaptive data-driven MR reconstruction.

Reconstruction

Various iterative MR image reconstruction algorithms provide respectively different performance. Iterative methods involve performing a large number of iterations before the results converge, and the regularization parameters are tuned to get optimal performance. The tuning can be expressed as a minimization problem. Given a set of raw MR data, the image reconstruction is performed several times using different parameter values, and the set of values resulting in the minimum error are selected. This minimization can be expressed as:

$$x = \underset{x}{\text{argmin}} \|Ax - y\|_2^2 + \lambda \|Tx\|_1 \qquad (1)$$

where x is the target image to be reconstructed, and y is the under-sampled raw k-space data. A is the MRI model to connect the image to MRI-space (k-space), which can involve a combination of an under-sampling matrix U, a Fourier transform F, and sensitivity maps S. T represents a sparsifying (shrinkage) transform. $\lambda$ is a regularization parameter. The first term of the right side of equation 1 represents the image fit to the acquired data, and the second term of the right side is a term added for denoising by reduction of aliasing artifacts due to under sampling. The l1 norm is used to enforce sparsity in the transform domain. $\|Ax-y\|_2^2$ is the l2 norm of the variation of the under-sampled k-space data. Generally, the lp norm is $$\sqrt[p]{\sum |x|^p}.$$

In some embodiments, the operator T is a wavelet transform. In other embodiments, the operator T is a finite difference operator in the case of Total Variation regularization.

Numerous iterative algorithms can be used to solve this kind of optimization problem, but in general, they have the following recursive update step for each iteration:

$$x_{t+1} = x_t + \alpha A^H(Ax_t - y) + T^H \text{shrink}(Tx_t) \qquad (2)$$

where $\alpha$ is the gradient step size that is to be determined by manual tuning, and shrink is a threshold operation to solve the l1 norm given by $\|x\|_1 = \Sigma_i |x_i|$. In manual tuning methods, the parameters are hand-tuned, and their selection is not part of the image reconstruction algorithm. Image reconstruction is the task of obtaining the image from measurements at each scan. Often such an iterative method involves 40-200 iterations of the reconstruction to find the optimum (e.g., minimum squared error) image corresponding to that scan.

This disclosure describes examples based on machine learning. The processing is split into two phases: an offline training phase where the goal is to identify an optimal set of reconstruction parameters that can be applied to many different images, and an online processing phase in which new MR data are scanned and the goal is to reconstruct the images using the reconstruction parameters learned during the training phase.

This disclosure describes a system and method using a deep neural network (DNN) for magnetic resonance (MR) image reconstruction. In some embodiments, data are input to the DNN to learn directly from the data what T should be and what $\lambda$ should be in equation (2) for a given under-sampling operator S (i.e., for a given MRI model A). Once the trained system is deployed with the set of decomposition, thresholding and reconstruction parameters learned during training, the system can reconstruct new images very quickly from new MR data that under-sampled using the same sampling mask used during training. For example, results achieved with the trained five-stage or six-stage (i.e., layer) DNN system according to this disclosure are comparable to results achieved by a general manually tuned system having 40-200 iterations.

Each layer of the network corresponds to a respective iteration of the MRI reconstruction model. An image of any size can be divided into a plurality of patches having a predetermined size (e.g., 5×5, 7×7, 9×9, 11×11 or the like). Each patch is subjected to multi-scale decomposition, thresholding and reconstruction. During training, a set of known full-scale images are under-sampled with a given sampling operator (mask) and processed. Based on the known full-scale images and the reconstructed images, the decomposition, thresholding and/or reconstruction parameters are obtained by a machine-learning algorithm such as backpropagation, RMSprop or ADAM. These machine-learned computed parameters can subsequently be used during clinical operation to rapidly reconstruct images. The system combines the advantages of patch-based representations with the computational efficiency of multiscale transforms. Non-patch and/or single scale may be used.

System Architecture

FIG. 1 shows a system 100 for acquisition of frequency domain components representing Magnetic Resonance (MR) image data for storage in a k-space storage array, as used by some embodiments. In system 100, magnetic coils 12 create a static base magnetic field in the body of patient 11 to be positioned on a table and imaged. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control unit 26. However, in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components comprising an MR dataset. The k-space array of individual data elements has a designated center, and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired using a Cartesian acquisition strategy as the multiple individual frequency components are sequentially acquired during acquisition of an MR dataset representing an MR image. A storage processor in the k-space component processor unit 34 stores individual frequency components acquired using the magnetic field in corresponding individual data elements in the array. The row and/or column of corresponding individual data elements alternately increases and decreases as multiple sequential individual frequency components are acquired. The magnetic field acquires individual frequency components in an order corresponding to a sequence of substantially adjacent individual data elements in the array, and magnetic field gradient change between successively acquired frequency components is substantially minimized.

Central control processor 26 is programmed to sample the MR signals according to a predetermined sampling pattern. Central control unit 26 also uses information stored in an internal database to process the detected MR signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Display processor 37 processes the magnetic resonance signals to provide image representative data for display on display 40, for example.

MR scanning system 100 is only exemplary, and a variety of MR scanning systems can be used to collect the MR data.

Data-Driven Reconstruction for a Given Sampling Pattern

Figure 2:
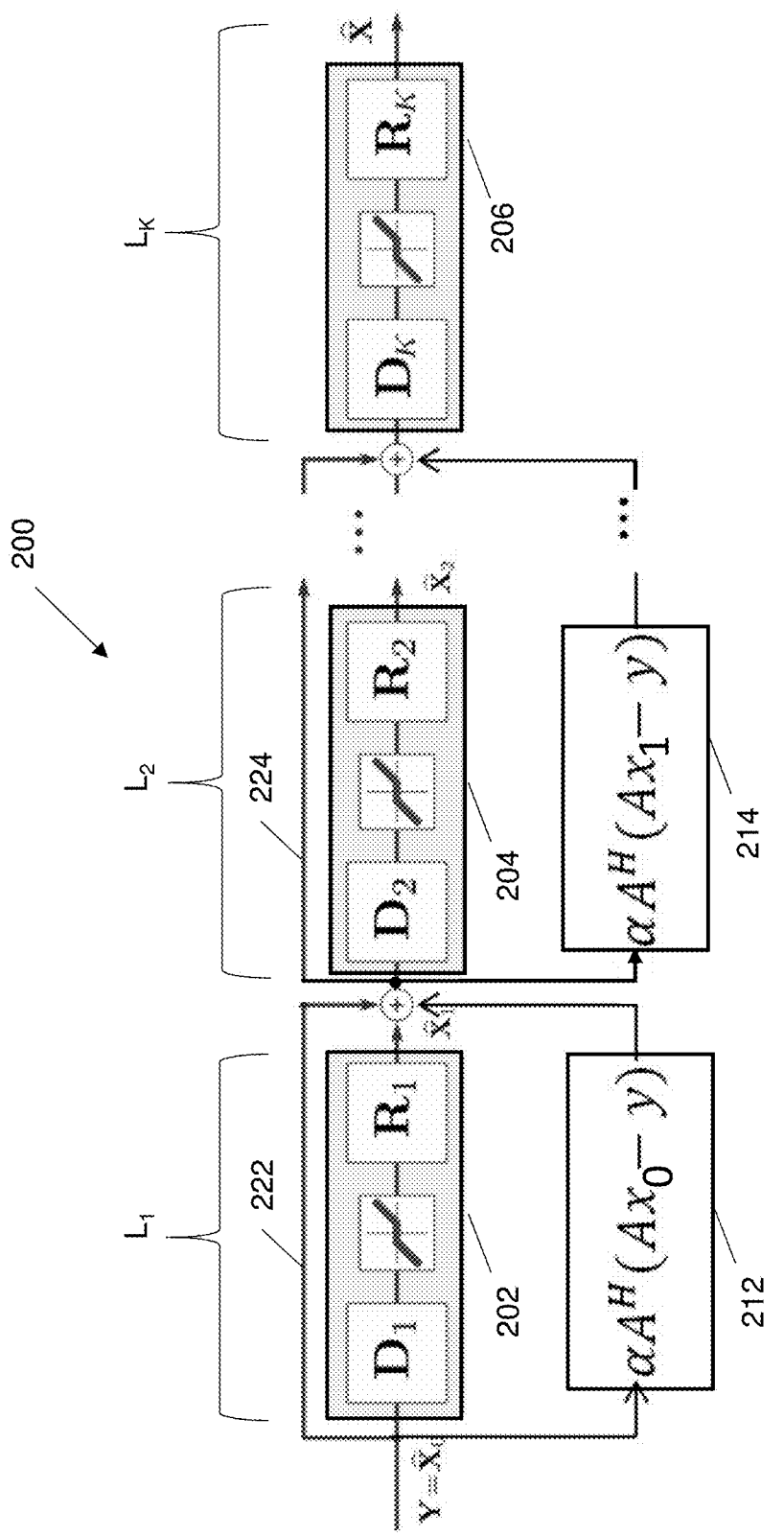
FIG. 2 is a block diagram of a deep neural network for MR image reconstruction according to some embodiments.

FIG. 2 is an illustration of a deep unfolding system 200 for reconstructing MR images, as the system 200 can be applied in some embodiments. The layers $L_1, L_2, \ldots, L_K$ shown in FIG. 2 form a neural network with K layers corresponding to specific operations of a recursive algorithm. Block 202, 204 and 206 contain respective $D_i$ and $R_i$ linear operations. The $D_i$ and $R_i$ operators each include a respective bank of filters, discussed in the description of FIG. 3B. In FIG. 2, the $D_i$ operator functions as an edge detector. The threshold operator $S_i$ performs a shrinkage function by zeroing out the weakest convolved coefficients output from the filters of the D operator, but does not change the size of the data array. The blocks 202, 204 and 206 are convolution/deconvolution and threshold layer that represents the l1 norm minimization, i.e., the $T^H \text{shrink}(Tx_t)$ component of equation (2). The blocks 212 and 214 represent the gradient update component $\alpha A^H(Ax_t - y)$ of equation (2) with step size $\alpha$. In each layer $L_1, L_2, \ldots, L_K$, the input image data, the reconstructed output data from the $R_i$ operator and the gradient step size update are provided to a respective summation node, where they are added together to update and further refine the image data.

In some embodiments, the step size α, the convolution filter weights and threshold value, and other model parameters are learned from a training data set. A series of fully-sampled images are used to train the network.

Depending on the system and training images used, the number of training images and the number of times the data are fed into the training algorithm can vary. In some embodiments, a signal-to-noise ratio (SNR) is computed after training with a set of under-sampled images to see whether the SNR is at least a threshold value (e.g., 20). In other embodiments, mean squared error (MSE) data are computed after training with a set of under-sampled image data to see whether the MSE is below a threshold value. In either case, if the SNR or MSE criterion is not met, an additional set of under-sampled training images are reconstructed beginning with the learned parameters from the previous training. The learned parameters are refined further, and the sequence is repeated until the SNR or MSE criterion is passed.

The system 200 performs MRI reconstruction with speed and accuracy without manual tuning. That is, for a given under-sampling operator, the step size α, the convolution filter weights and thresholding function parameter are computed based on a fully sampled set of known images and a corresponding set of images reconstructed from an under-sampled set of data from the fully sampled set of known images. In some embodiments, as few as five iterations (i.e., layers) are sufficient to reach good images quality. The parameters of the reconstruction, including the constraint weights (realized by convolution layers), are learned from the data, and are subsequently able to achieve better results on new images in very small number of iterations.

The D operator has a bank of filters, and performs decomposition by convolving each individual filter with the image data. The k-space data Y is raw data, where an operator A performs an initial conversion between the raw data to an image, represented as $A^T y$. The D operator computes the result of applying each individual filter to the input image, and outputs a plurality of filter response arrays, each representing a transform of the image data by a respectively different filter. Each of the filter response arrays contains a plurality of coefficients. For example, one of the filters can be a 5×5 or 7×7 array of coefficients. The thresholding operator has a thresholding nonlinearity that zeroes out any coefficients having values less than a threshold value, and outputs shrunk data. The R operator is a reconstruction operator implemented with deconvolution. The filter of the R operator is applied to the shrunk data to return the shrunk data to the image domain, and the output values of the R operator are added together to provide a total reconstructed image data. The output of the R operator is a single array having the size of the image.

The D and R operators efficiently operate on images of arbitrary sizes. In some embodiments, the network is trained by adjusting the weights (coefficients) in the layers $D_i$ and $R_i$ to minimize a specific loss function between the "ground truth" (i.e., fully sampled, clean training) images and their corresponding reconstructed under-sampled images. In some embodiments, the network is trained by adjusting parameters controlling the shape of the thresholding function. In some embodiments, the network is trained by adjusting the weights (coefficients) in the layers $D_i$ and $R_i$ and parameters controlling the shape of the thresholding function. The loss functions applied by the system 200 can be a minimization of mean squared error (MSE) or a maximization of structural similarity (SSIM), for example. In some embodiments, after training, the network provides efficient operators for fast MR image reconstruction, using the coefficients and parameters computed during training.

The system 200 illustrated in FIG. 2 provides automatic tuning (i.e., automatic computation of the D filter coefficients, the thresholding operator parameter, and the R filter coefficients). There is no need for manual tuning of the regularization parameters.

For reconstruction of images in a clinical setting (using a previously trained system), the reconstruction time can be controlled by varying the depth of the network. For training purposes, the D filter coefficients, the thresholding operator parameter, and the R filter coefficients can be ascertained from a network having five or six layers.

To achieve these benefits, over-complete patch dictionaries are used herein as domains for sparse image representation. That is, each p×q patch is decomposed as a linear combination of the atoms in a dictionary D, a threshold is applied to the computed coefficients, and then the sparsified image is reconstructed with an inverse transformation R. The resulting image is then assembled by averaging overlapping patches.

FIG. 3A is a detailed block diagram of an embodiment of one layer $L_1$ of the DNN 200 of FIG. 2. The layer L1 of FIG. 3A is a multi-scale denoising autoencoder. Each layer $L_2, \ldots, L_K$ has a structure similar to the structure of layer $L_1$. To be able to achieve good quality of reconstruction, larger patch sizes (e.g., 5×5, 9×9, and 17×17 patches) can be used in the image representation. However, working with larger patches quickly becomes computationally expensive since the number of atoms in the dictionary D grows as well and the cost to decompose a patch increases with its size. To overcome this difficulty, the apparent image self-similarity observed across multiple scales can produce a multiscale patch-based image representation. This representation is based on the idea of subsampling the image and processing its smaller versions with the same dictionary of small patches. When the thresholded and reconstructed patches are up-sampled back to the original size, this strategy corresponds to processing the initial image with larger (albeit simpler) patches.

Figure 3B:
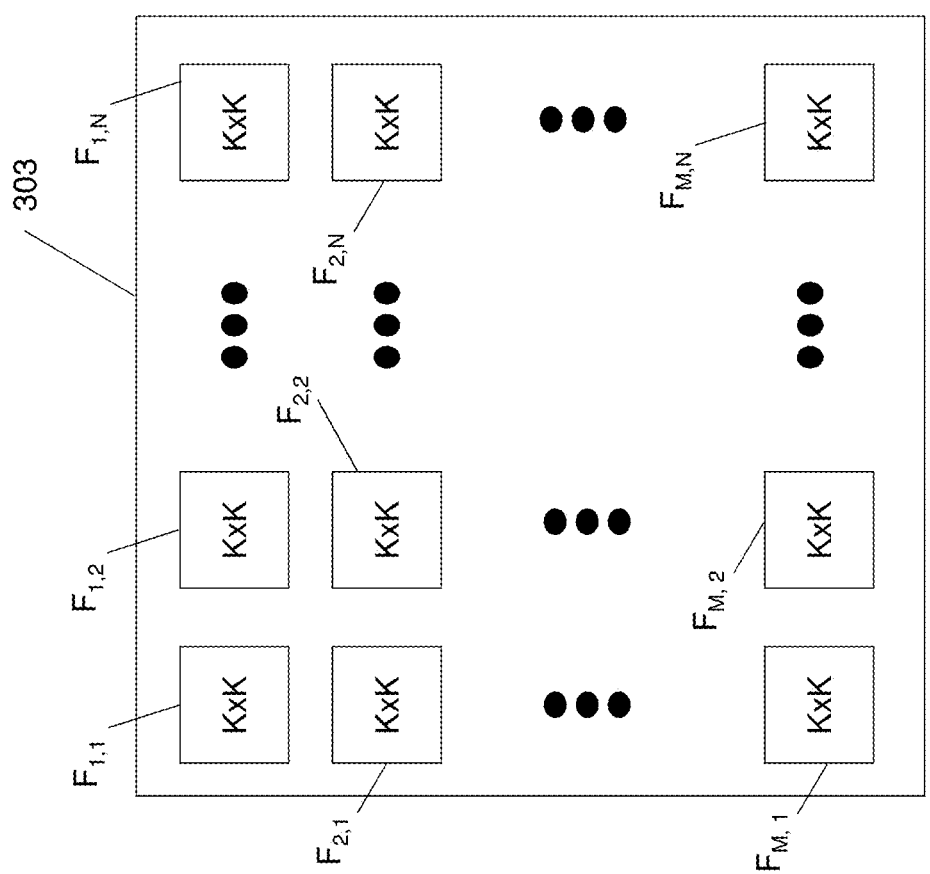
FIG. 3B is a diagram of an exemplary embodiment of a decomposition block of the layer of FIG. 2.

In FIG. 3A, y is an input image data (e.g., initially the measurement k-space data converted to image space with the model A of the MRI system), and $\hat{x}$ is updated reconstructed image data at the output of the layer L1. The input data y is provided to a decomposition/thresholding/reconstruction (DTR) block 300. The DTR block 300 has a decomposition block 303, which applies a bank W of convolution filters (filter bank) to the input image data array y. FIG. 3B shows an example of a filter bank W. The filter bank W has a plurality of linear filters $F_{1,1}, F_{1,2}, \ldots F_{N,N}$. For example, in various embodiments, the filter bank W can have 10, 15, 20 or 25 filters. Each filter $F_{1,1}, F_{1,2}, \ldots F_{N,N}$ is an array having a predetermined kernel size (e.g., 5×5 or 7×7). The filter coefficients are unknown prior to training, and are determined during training. The filter bank W applies a different decomposition transform to the input image data y, and transforms the image data into a respectively different set of k-space data. For example, the filters can perform a Fourier transform, and each filter can represent the MR image data sensed by a sensor located at a respectively different location relative to the subject. The output of the filter bank W includes M×N images, each representing a respectively different filter response to the image data.

The thresholding block 304 applies a thresholding function to the k-space data. The thresholding function eliminates frequency components having a magnitude smaller than a threshold value. The thresholding function 304 operates separately on each of the filter response array coefficients output from the decomposition block 303. The output of the thresholding block 304 has the same dimensions as the input to the thresholding block 304.

In some embodiments, the thresholding function is non-linear. In some embodiments, the thresholding function has a non-linear value α, which is recursively computed during the training. Note that the thresholding variable α in equations (3) and (4) below is a different parameter from the gradient step α between layers in equation (2) above.

Figure 5:
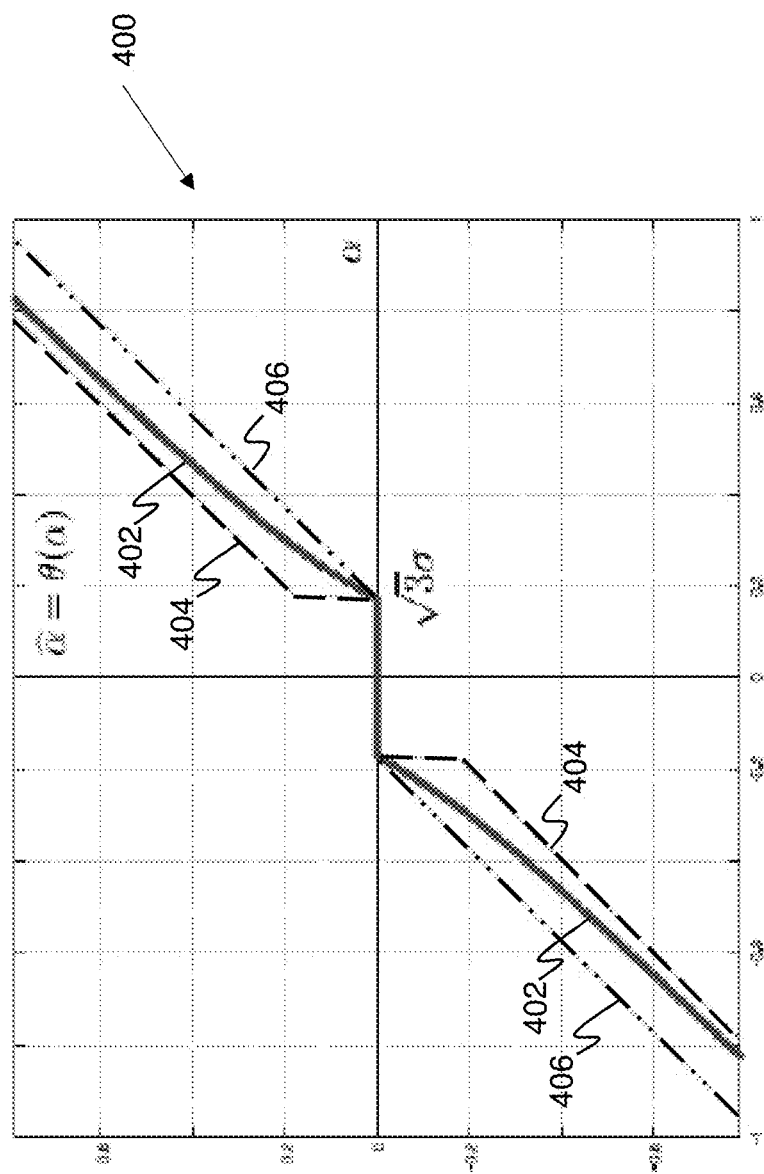
FIG. 5 is a diagram of an exemplary embodiment of a thresholding function for the thresholding block of FIGS. 2 and 3A.

For example, FIG. 5 shows three non-linear thresholding functions 402, 404, and 406. Each of the three thresholding functions has an ordinate value of zero when the value of the abscissa is between $-\sqrt{3}\sigma$ and $\sqrt{3}\sigma$. Thresholding function 406 has the form $y=\alpha-\sqrt{3}\sigma$, if $\alpha>\sqrt{3}\sigma$, and $y=\alpha+\sqrt{3}\sigma$, if $\alpha<-\sqrt{3}\sigma$. Thresholding function 404 has the form $y=\alpha$, if $\alpha>\sqrt{3}\sigma$, or $\alpha<-\sqrt{3}\sigma$. In some embodiments, the thresholding function 402 is a garrote function, as shown in FIG. 5 and defined in Equation (3). The thresholding function 402 asymptotically approaches the value of thresholding function 404 for $|\alpha|>>\sqrt{3}\sigma$. That is, the slope of the thresholding function 402 approaches unity for $|\alpha|>>\sqrt{3}\sigma$. In some embodiments, during each iteration of the image reconstruction, a new value $\hat{\alpha}$ and a new value σ are computed based on the most recent previous value of α, according to the equations:

$$\hat{\alpha} = \frac{(\alpha^2 - 3\sigma^2)+}{\alpha} \qquad (3)$$

and $$\hat{\alpha} = \theta(\alpha) \qquad (4)$$

where Θ is the function 402 shown in FIG. 5, σ is the parameter learned through training, and the + in the numerator of equation (3) means the positive part, defined as the greater of $\alpha^2-3\sigma^2$ and zero. σ is a measure of deviation. σ is analogous to a standard deviation of a Gaussian variable, but in this case, the underlying variable is not necessarily Gaussian. With each iteration, $\hat{\alpha}$ and σ are refined. By using a thresholding function with a single parameter σ to be learned by training, the training is much quicker than is possible with a thresholding function having many parameters.

The thresholding function of FIG. 5 eliminates small coefficients, and asymptotically approaches identity when coefficients are very high, to preserve them. Although the thresholding is mathematically similar to denoising, the components removed are not necessarily noise, and may be aliasing components, for example. The function 404 is identity when far from zero. Function 402 asymptotically approaches the function 404, so the thresholding using the function of function 402 does not lose strong features. The function 406 provides soft thresholding, which can be used for N1 minimization.

Referring again to FIG. 3A, a multiscale patch-based processing system L1, according to some embodiments is shown. This system L1 combines the advantages of patch-based representations with the computational efficiency of multiscale transforms. Briefly, the system L1 decomposes an image and recursively applies a dictionary-based process.

The system L1 operates on p×q patches, repeating on further decomposition levels. On each level of decomposition, the subsampled image is processed by a respective block 300, 301, or 302 with patches of the same small size (e.g., 5×5 pixels), which effectively results in using larger patches in the original image (as shown schematically in FIGS. 4A-4C). In FIG. 3A, the number of levels can be set to provide a tradeoff between computational complexity and image quality. Additionally, the number of levels can be capped to avoid over processing the data in a manner that reduces its overall quality. After reconstruction, a high-pass filter (HPF) 306 is applied to recombine the results.

To facilitate decomposition and recursion in the system L1, a low-pass filter (LPF) 307 and a down-sampling operator (not shown) are applied to the input image data y. The down-sampled image data is then used as input into the block 301 and to another LPF 314 and second down-sampling operator (not shown). The once-down-sampled data from LPF 307 are supplied to processing block 301. The twice-down-sampled data from LPF 314 are supplied to processing block 302. As processed twice-down-sampled data from block 302 is returned, an up-sampling operator (not shown) and low-pass filter 318 are applied before combining with the results of the high-pass filter 311. As processed down-sampled data from block 301 is returned, the data are passed through an HPF 311, and combined with the data from LPF 318, an up-sampling operator (not shown) and low-pass filter 312 are applied before combining with the results of the high-pass filter 306 to yield the updated image $\hat{x}$.

To efficiently combine the images reconstructed from patches of different sizes, the patch based processing scheme is combined into a multiscale subsampled representation (such as with an orthogonal wavelet transform) which otherwise achieves perfect reconstruction. Effectively, this places more emphasis on reconstructing higher frequency components (such as sharp edges and fine patterns) with patches of smaller sizes, while low pass filtering in the down-sampled branch suppresses aliasing effects. While the structure presented in FIG. 3A corresponds to three scales of the thresholding algorithm in the layer L1, multiple layers of the network can be stacked sequentially to form a deeper network as shown in FIG. 2. After proper initialization (e.g., using a K-SVD dictionary trained on 5×5 patches to initialize the layers D and R and Daubechies wavelets of 4-pixel support for the corresponding low- and high-pass filters), the entire network can be trained with the backpropagation algorithm on the set of training images. This use of multiple layers in a sequential manner has the effect of increasing both the Peak Signal to Noise Ratio (PSNR) and the structural similarity (SSIM) of the data.

The system 200 in FIG. 2 can be trained such that each layer $L_1, L_2, \ldots, L_K$ learns to reduce the errors/artifacts of the previous layers. The results of the first layer $\hat{x}_1$ are linearly recombined with the original image y. This combination is then used as an input for the next layer L2 in the sequence. After a desired number K of layers (i.e., iterations) the reconstructed image $\hat{x}_K$ is output. In some embodiments, functionality can be included in the system 200 to check for convergence between different levels as the processing is recursively performed.

Referring again to FIG. 3A, the reconstruction block 305 has a bank of filters $W^T$, where $W^T$ is the Hermitian adjoint of W. The reconstruction block 305 applies a respective filter to each of the thresholded k-space data arrays output from the thresholding block 304. The filtered images from all of the filters in reconstruction block 305 are summed together to provide reconstructed image data. The image data output from the DTR block 300 are passed through a high pass filter (HPF) 306, and the higher frequency components are provided to summing node 320.

The DTR blocks 301 and 302 are similar to DTR block 300 in function. DTR block 301 has a decomposition block 308, a thresholding block 309 and a reconstruction block 310, similar to the corresponding blocks 303-305 described above. The filters within the decomposition block 308 and reconstruction block 310 can be the same as, or different from, the coefficients of the filters in DTR block 300. DTR block 302 has a decomposition block 315, a thresholding block 316 and a reconstruction block 317, similar to the corresponding blocks 303-305 described above. The filters within the decomposition block 315 and reconstruction block 317 can be the same as, or different from, the coefficients of the filters in DTR block 300.

The input image data y is passed through a low pass filter (LPF) 307 and then the low frequency components are input to DTR block 301 and LPF 314. The reconstructed images output from DTR block 301 are passed through an HPF 301 and provided to summing node 321. The low frequency components output by low pass filter (LPF) 307 are also input to LPF 314, which can have a lower cutoff frequency than LPF 307. LPF 314 provides the twice low-pass-filtered image data to DTR block 302. The reconstructed image data output from DTR block 302 is passed through LPF 318, and provided to summing node 321. Summing node 321 combines the high frequency components from DTR block 301 and the low frequency components from DTR block 302. The output of summing node 321 is passed through LPF 312. Summing node 320 combines the high frequency components from DTR block 300 and the low frequency components from summing node 321. The low frequency components output from LPF 312 are added to the high frequency components from HPF 306 in the summing node 320 and output as the updated reconstructed image data x̂ 313.

FIGS. 4A-4C schematically show an example of an input image 400, 402, and 404 to the filter banks 303, 308 and 315 at all three scales, with the constant size of the W filters represented by the white squares 401, 403, and 405, respectively. The embodiment of FIG. 3A reduces the scale of the image, applies a small filter to the image (which has effectively been zoomed out). Because the image in FIG. 4B is smaller than that of FIG. 4A, the same-sized filter covers a bigger part of the image after down-sizing. Similarly, the filter covers an even larger part of the twice-down-sampled image in FIG. 4C. Thus, using a small filter and a down-sampled image one can obtain results similar to using a large filter on a fully sampled image. This enables the system of FIG. 3A to run faster. To change the size of the image data, a LPF 307, 314 is used, followed by down-sampling.

Referring again to FIG. 2, each of the other layers $L_2, \ldots, L_K$ can be embodied by a multi-scale system as shown in FIG. 3A. As noted above, for training purposes, five to six layers provides good results.

Figure 6:
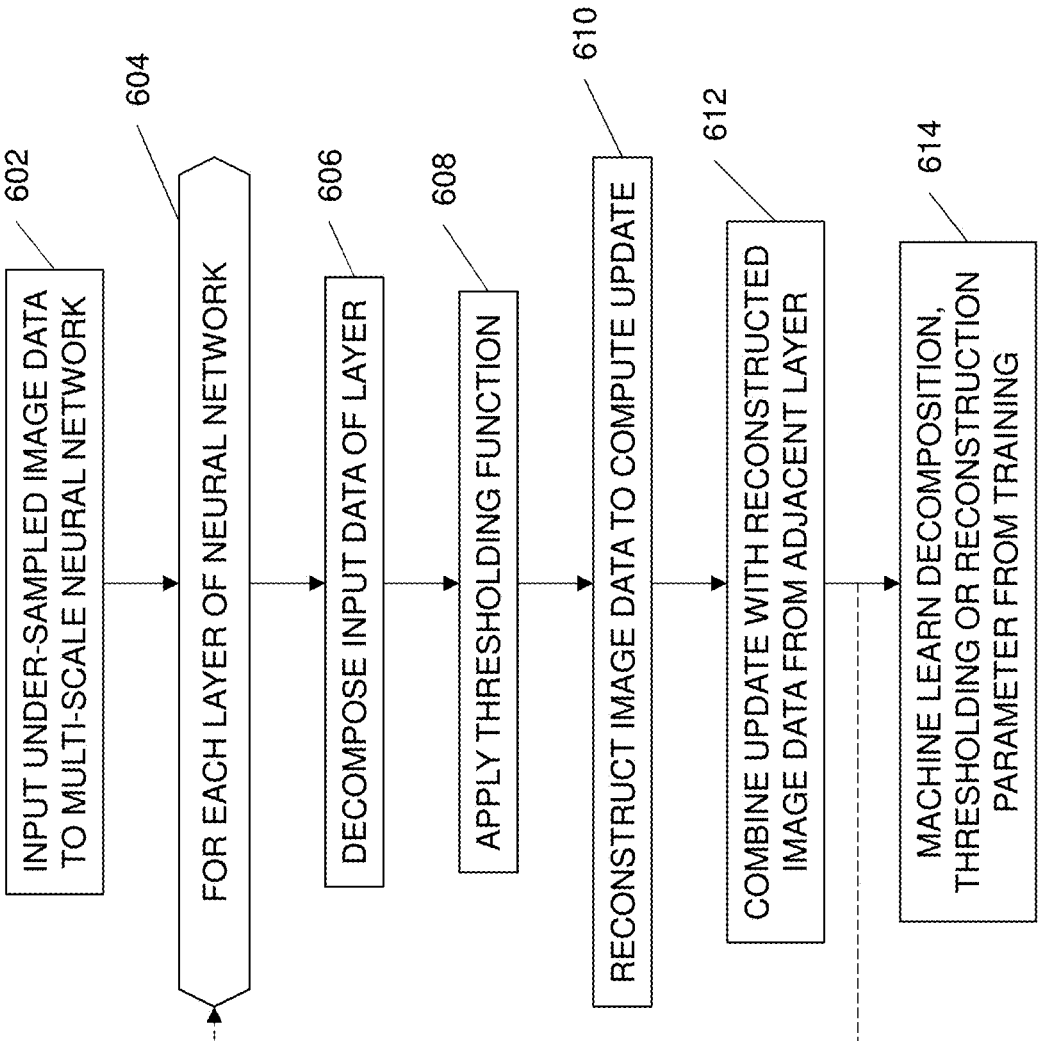
FIG. 6 is a flow chart of a method of obtaining MR image reconstruction parameters by training the system of FIG. 2.

FIG. 6 is a flow chart of an exemplary method for training an MR system to learn the decomposition filter coefficients, thresholding function parameters, and reconstruction filter coefficients.

At step 602, a set of under-sampled image data are input to the multi-scale neural network. The data are under-sampled from a plurality of known fully sampled images. A variety of under-sampling masks can be used. For example, the under-sampling can be performed using a random sampling mask or with a mask optimized to reduce sample coherence.

At step 604, a loop containing steps 606-612 is performed once for each iteration (layer of the DNN).

At step 606, the image data are decomposed into a plurality of filter response arrays of k-space data, corresponding to the convolution of the image data with each respective filter of the filter bank. This transforms the image data to a plurality of k-space data arrays.

At step 608, the k-space data from the decomposition filters are sparsified by applying a thresholding function to each of the k-space data individually, to remove low-magnitude high-frequency components.

At step 610, the thresholded k-space data are reconstructed by deconvolution of the k-space data with a plurality of filters and summing the results of all of the filters. The output of the reconstructed data corresponds to the l1 norm update, $T^H \text{shrink}(Tx_t)$ from equation (2).

At step 612, the reconstructed image from the previous level of the DNN is added to the l1 norm update computed of step 610 and a regularization update to compute the output of current level of the DNN.

At step 614, after the training image set has been reconstructed, the decomposition, thresholding and/or reconstruction parameters are machine-learned from the trained system.

Figure 7A:
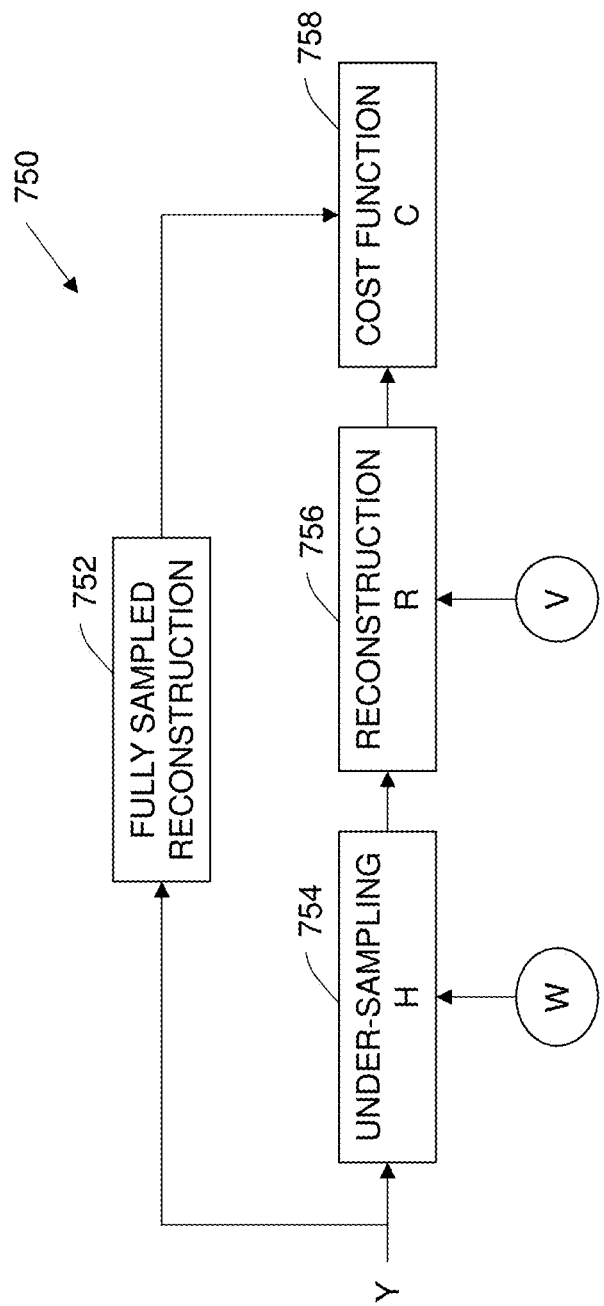
FIG. 7A is a block diagram of an exemplary system for obtaining MR sampling and image reconstruction parameters by training the system of FIG. 2.

FIG. 7A is a block diagram of an exemplary embodiment of a system 750 for machine learning the sampling and reconstruction parameters from training the DNN. As discussed above, the system of FIG. 2 uses machine learning to determine optimized decomposition, thresholding, and reconstruction parameters for use with a particular predetermined sampling mask; to use a different sampling mask, the system of FIG. 2 is re-trained and a new set of decomposition, thresholding, and reconstruction parameters are learned. The embodiment of FIG. 7A does not have a predetermined sampling mask; an optimized sampling operator is machine-learned during training.

In FIG. 7A, the reconstruction block R can be the same as the neural network 200 of FIG. 2, and a description thereof is not repeated. At the input on the left is the "ground truth", i.e., a fully-sampled image, Y. The system of FIG. 7A is configured for learning parameters to reconstruct the image and also learning parameters for under-sampling the image. The whole pipeline (including the under-sampling operator H 754, the reconstruction operator R 756, and the cost function C 758 applies under-sampling and reconstructs images, and then computes the cost function 758 for performing the training. In FIG. 7A, W represents parameters for the image data to be sampled, and V represents parameters for the under-sampling. As the system 750 is trained, it identifies an optimized sampling operator. At the conclusion of the training, the system 750 identifies the under-sampling mask that provides an image data sample optimized to produce the best cost function result.

In some embodiments, the sampling mask is a probability mask. Every measurement has a respective probability of being sampled, the different measurements are sampled or skipped independently from each other, and the probability can be any real number between zero and one. The average loss is an average computed over all masks generated according to the probability distributions during the training. One of the tasks of the training is to learn these probabilities (of each measurement being sampled.), i.e. to learn how to acquire the data. In other embodiments (not shown), the mask is a binary mask, and each measurement is either sampled or not sampled.

In FIG. 7A, the parameters V (for reconstruction) include all trainable parameters discussed above for reconstruction (including step size α, threshold σ, decomposition operator D, reconstruction operator R) that are trainable for reconstruction. The parameter H is one particular binary mask, and w is the array containing the probabilities of sampling each individual measurement. Every measurement can have a different probability potential w.

The loss function L(w,v) for is defined by equation (5):

$$L(w, v) = E_{y,H}(C(R(v, H(y))))$$
$$= \sum_H p(H, w) E_y(C(R(v, H(y))))$$
$$= \sum_H p(H, w) f(H, v)$$
(5)

where H(y) is the mask (under-sampling) function, R(v,H) is the reconstruction operator with parameters v and H, C is the cost function, and $E_{y,H}$ is the expected value or average, taken over the image data Y. The under-sampling mask operator H, p(H,w) is the probability of a mask given a specific measurement. $f(H,v)$ is a function of H and v combining the expected value (average) $E_y(C(R(v,H(y))))$ for a given input sample y and reconstruction parameters v.

The under-sampling layer is stochastic both at training and test time. The dependency in the weights w shows up in the total mask probability of H. The loss is averaged over H too. There are a combinatorial number of possible patterns.

The training loss is thus computed by averaging across training data and different masks that can be computed by these probabilities, and then averaging over the masks. Taking the average over the masks means computing the sum of all possible masks of the probability to generate that particular mask, given the probability w of the individual measurements. The sum represents the loss of the data, and does not depend on the individual probabilities anymore. The function $f$ depends only on the under-sampling operator and the parameters of reconstruction.

To model the probability p(H,w), an independent Bernoulli mask model can be used, according to equations:

$$p(H, w) = \prod_i p_i(h_i, w_i)$$
(6)

$$p_i(h_i, w_i) = w_i, h_i = 1$$
(7)

This method relaxes the under-sampling problem so the dependence in the weight appears in the probabilities $h_i$ to get the individual mask. The sampling process is modeled as having a probability to pick every measurement, so the probability of the mask as a whole is the product of the probabilities to pick every measurement sampled in that mask.

Given a matrix of probabilities to make masks, a function is used to generate random inputs and apply that to the probability function. The probability to generate the mask H is the product of the probabilities $w_i$ to pick $h_i$ every measurement. For a particular binary mask, there are some measurements that are picked, but have a probability less than one, and some measurements that are not picked have a probability greater than zero. So the probability to get a particular mask is $p_i(h_i,w_i)=w_i$ if that mask $h_i$ is one, and it's $p_i(h_i,w_i)=1-w_i$ if that mask $h_i$ is zero. That is, the method selects at random for every voxel whether that measurement is sampled or not, with probability $w_i$. One can compute an estimate of the gradient $$\frac{\partial L}{\partial w_i}$$

(w,v) of the loss using equation (8).

$$\frac{\partial L}{\partial w_i}(w, v) = \sum_H \frac{\partial p}{\partial w_i}(H, w) f(H, v)$$
$$= \sum_H \prod_{j \neq i} p_j(h_j, w_j) \frac{\partial p_i}{\partial w_i}(h_i, w_i) f(H, v)$$
$$= \sum_H p(H, w) \frac{1}{p_i(h_i, w_i)} \frac{\partial p_i}{\partial w_i}(h_i, w_i) f(H, v)$$
$$= E_H\left(\frac{\partial \log p_i}{\partial w_i}(h_i, w_i) f(H, v)\right)$$
(8)

Once the gradient $$\frac{\partial L}{\partial w_i}(w, v)$$

is computed, it can be used when training. When training, process is to take data to generate the mask at random, using the probabilities that are currently computed and to do a gradient step on the weight $$\frac{\partial L}{\partial w_i}(w, v)$$

to try to optimize the probability.

The process of training includes:
using the probability $w_i$ to generate a mask;
then using that mask and data, compute the loss; and
computing the gradient step $$\frac{\partial L}{\partial w_i}(w, v)$$

using that loss, to obtain the probability w. The gradient step $$\frac{\partial L}{\partial w_i}(w, v)$$

is subtracted from w.

The machine learning for the under-sampling operator is performed in a manner similar to that used in the reconstruction steps, but optimizing the mask parameters w, not the image reconstruction parameters v. For the system of FIG. 7A, when training, instead of optimizing over X, or the image data, the machine learning is used to optimize over weights, as described by equation (9):

$$w_{t+1} = w_t - \alpha \frac{\partial L}{\partial w_i}(w, v) \qquad (9)$$

In some embodiments, an extra constraint is added by putting a constraint on the expected total number of samples to have 1 (i.e., the measurement is kept) in the mask for under-sampling the image. Some embodiments add a penalization by summing $w_i$ with a weight λ. When the penalization is included, there is an extra weight, an extra λ, in the gradient.

$$w_{t+1} = w_t - \alpha \frac{\partial L}{\partial w_i}(w, v) - \lambda \qquad (10)$$

where λ=penalization.

Using the above method, the sampling mask and the reconstruction parameters are trained together. In general, the reconstruction will be adapted to the type of under-sampling being used.

Figure 7B:
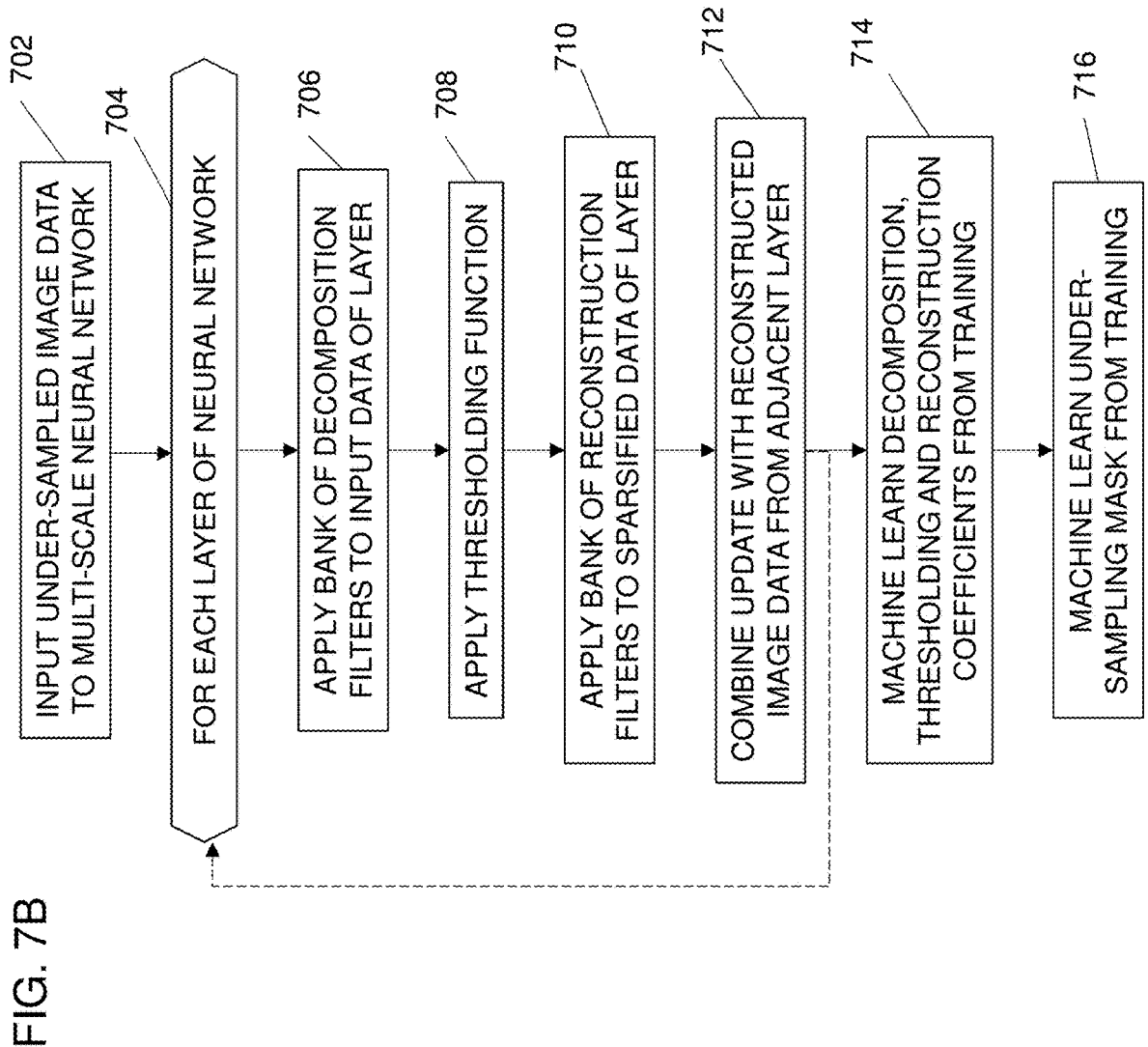
FIG. 7B is a flow chart of a method of obtaining MR sampling and image reconstruction parameters by training the system of FIG. 7A.

FIG. 7B is a flow diagram of a method for learning reconstruction and under-sampling parameters during training of a DNN for reconstructing MR images.

At step 702, a set of under-sampled image data are input to the multi-scale neural network. The data are under-sampled from a plurality of known fully sampled images. A variety of under-sampling masks can be used. For example, the under-sampling can be performed using a random sampling mask or with a mask optimized to reduce sample coherence.

At step 704, a loop containing steps 706-712 is performed once for each iteration (layer of the DNN).

At step 706, the image data are decomposed into a plurality of filter response arrays of k-space data, corresponding to the convolution of the image data with each respective filter of the filter bank. This transforms the image data to a plurality of k-space data arrays.

At step 708, the k-space data from the decomposition filters are sparsified by applying a thresholding function to each of the k-space data individually, to remove low-magnitude high-frequency components.

At step 710, the thresholded k-space data are reconstructed by deconvolution of the k-space data with a plurality of filters and summing the results of all of the filters. The output of the reconstructed data corresponds to the l1 norm update, $T^H \text{shrink}(Tx_t)$.

At step 712, the reconstructed image from the previous level of the DNN is added to the l1 norm update computed of step 710 and the regularization component to compute the output of the current level of the DNN.

At step 714, after the training image set has been reconstructed, the decomposition, thresholding and/or reconstruction parameters are machine-learned from the trained system.

At step 716 the sampling mask (operator) is machine-learned from the trained system.

FIG. 8A-8H show the performance of the DNN learning results, in mean squared error (MSE) numbers, comparing to traditional iterative algorithms such as Conjugate gradient (CG) sense, and Total Variation (TV) constrained compressed sensing (CS) sense. The CG sense and TV constrained CS sense methods do not use machine learning. The CG sense method is a linear reconstruction, un-regularized without the l1 term.

FIGS. 8A-8H show test data set results, with MSE number labelled. FIG. 8A shows a fully-sampled test image, with an MSE of approximately zero. FIG. 8B shows the result of directly reconstructing under-sampled image data with zero-padding (inserting zeroes for measurements that are not sampled), with an MSE of 4.57. FIG. 8C shows the result of applying the multi-scale model without training (e.g., using random coefficient values in the D and R filters), with an MSE of 17.3. FIG. 8D shows the results using the same multi-scale model after training, providing an MSE of 2.52. FIGS. 8E and 8F show the results of using a CG model after 5 and 20 iterations, yielding MSEs of 4.53 and 4.28, respectively. FIGS. 8G and 8H show the results of using a TV model after 5 and 20 iterations, yielding MSEs of 3.51 and 2.92, respectively. The learning result (After-training) in FIG. 8D has the best MSE among all of the under-sampled methods (i.e., better than all except for the fully-sampled image of FIG. 8A).

Sampling-Adaptive Data-Driven MR Reconstruction

MR compressed sensing enables faster scans (e.g., 30 seconds instead of 4 minutes), so is more robust to motion. Reconstruction from compressed sensing depends on the sampling pattern resulting from various scan settings. For example, the acceleration setting trades between an amount of under sampling to increase speed and the image quality. Different operators may have different preferences for this trade off. Differences in the application, patient being scanned (e.g., overweight patient), or MR scanners may call for different scan settings, resulting in different sample patterns in MR compressed sensing. Data-driven approaches to reconstruction learn optimal settings for one sampling pattern, but would have to be re-trained if the sampling pattern changes. Rather than re-training or training multiple models for a set of sample patterns, deep reinforcement learning is used to train one machine-learnt network to provide optimized reconstruction for any different sample pattern. A parameter-free reconstruction that may reconstruct images scanned with any sampling pattern with optimal reconstruction time and image quality is provided. The deep reinforcement training learns a policy for determining a sequence of actions in setting the reconstruction parameters through a plurality of iterations that result in an optimized reconstruction.

Figure 10:
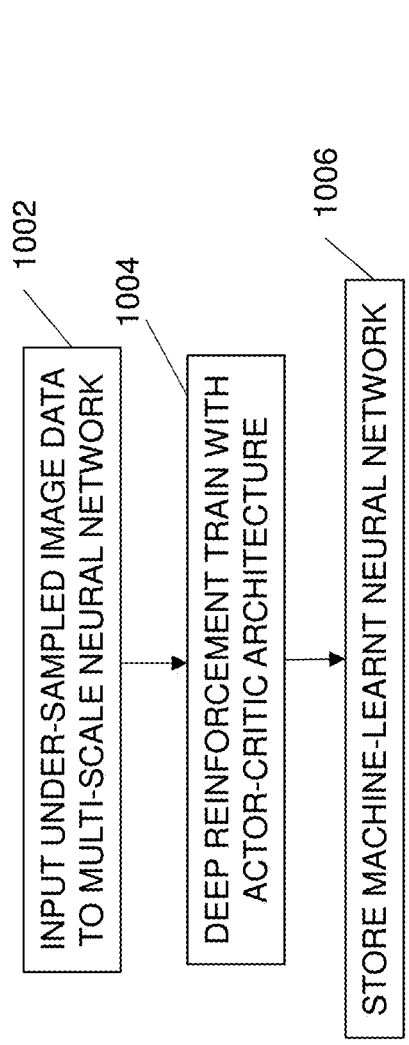
FIG. 10 is a flow chart diagram of an example method for deep reinforcement machine training.

FIG. 10 illustrates one embodiment of a method for training a network for MR reconstruction from signals collected by an MR scanner. Deep reinforcement learning trains a policy for determining actions in a reconstruction parameter space for reconstructing an MR image from under sampled measurements of any sampling pattern.

Figure 9:
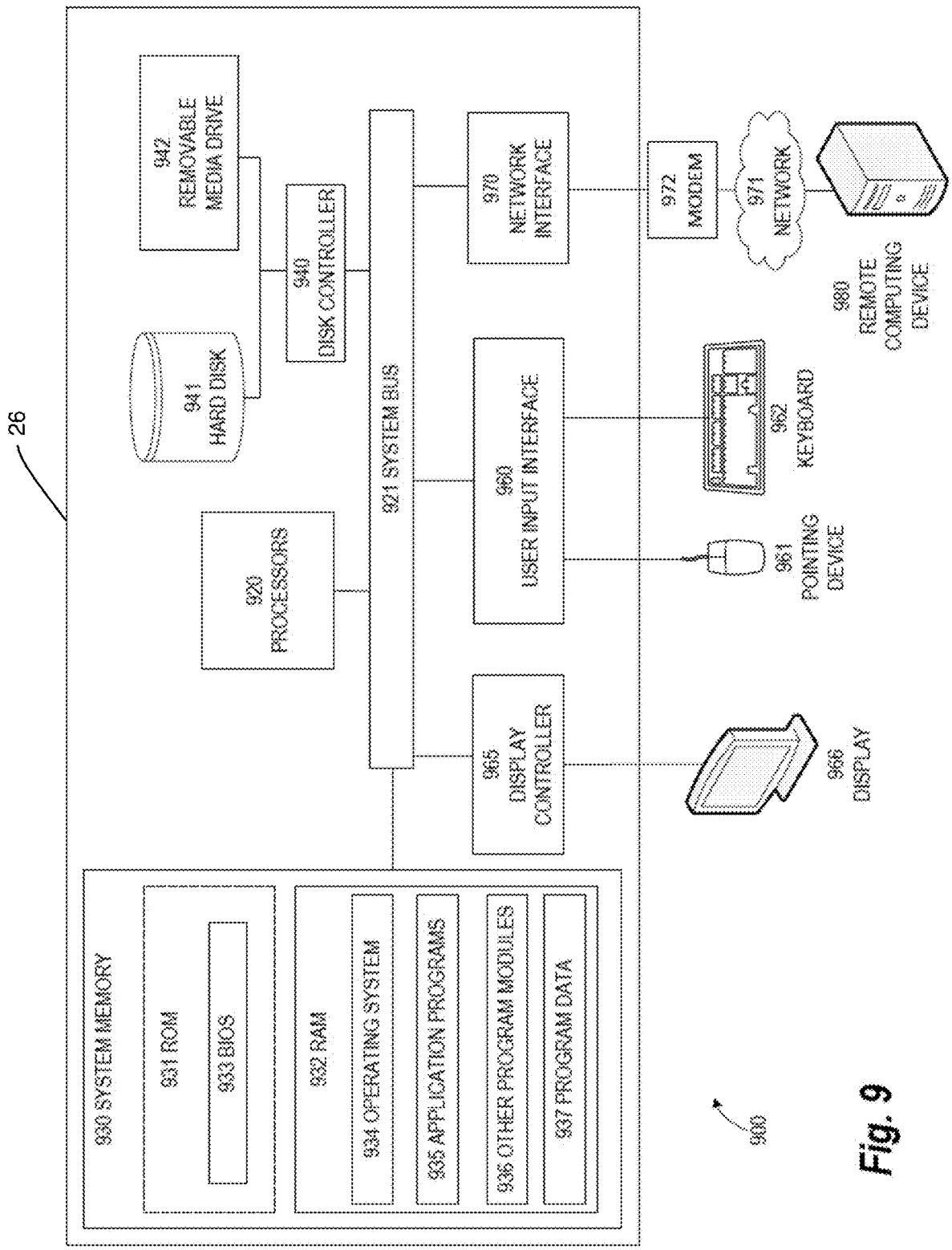
FIG. 9 is a detailed block diagram of an example of the computer system suitable for the system of FIG. 1, according to some embodiments.

The method of FIG. 10 is performed by the systems of FIGS. 1, 9 and/or 15, or another system. For example, one or more MR scanners acquire MR scan data (e.g., k-space data) with full sampling for act 1002, and an image processor creates under sampled scan data in act 1002 and performs training in act 1004. A memory stores the resulting network in act 1006.

The acts are performed in the order shown or other orders. Additional, different, or fewer acts may be used. For example, acts for scanning, for establishing an architecture of the machine learning network, and/or for selecting input metrics for reinforcement learning are provided.

In act 1002, training data is gathered. Since the training is to adapt to variance in the sample pattern, the training data includes many sets of image data or k-space measurements with different sampling masks. Fully-sampled image data (e.g., k-space data) is acquired from multiple patients. An image processor simulates under sampling. For each of the sets of fully-sampled image data, one or more sets of under-sampled image data are created. Under-sampled scan data is formed from the full sampling. Any number, such as tens or hundreds, of sample masks are used to simulate under sampling for each of the fully-sampled image data sets. The simulation provides many examples that may result from different scan settings, patient anatomy, MR scanner characteristics, or other variance that results in different sampling masks in MR compressive sensing.

The training data also includes ground truth information. For reconstruction, the ground truth is the desired image. The ground truth for each simulated under-sampled image data set is a reconstruction from the respective fully-samples image data set. Using reconstruction, an MR image is generated for each fully-sampled image data set. The reconstructed MR image is the ground truth for each of the under-sampled image data sets simulated from that respective fully-sampled image data set.

The training data also includes inputs used for training reinforcement. One or more metrics, such as metrics of the covariance of the aliasing artifacts resulting from under sampling, are used. For example, the power spectrum of the k-space data, the sampling mask, and/or the noise level are used. The power spectrum of each under sampled image data set is calculated. The sampling mask of each simulation of under sampling is determined. The noise level for the MR scanner corresponding to each fully-sampled image data set is measured by pre-scanning to measure response without exciting the tissue (i.e., without transmitting radio frequency pulses). Other metrics reflecting characteristics of the pulse sequence design or calibration of the MR scanner may be used.

In act 1004, the image processor applies deep reinforcement machine learning. The machine learns from the training data. The broad range of multiple examples of k-space measurements for each of a range of different sampling patterns corresponding to under sampling is used to learn.

The learning is deep reinforcement learning. Deep learning uses a neural network. The reinforcement learning learns to decide next acts in an action space given an image. The reinforcement learning also learns using other metrics, such as the covariance information.

Any architecture or layer structure for the deep reinforcement learning may be used. In one embodiment, an actor-critic architecture is trained. The actor-critic architecture has an actor to perform each iteration of reconstruction and a critic to decide a change or action in one or more rendering parameters (e.g., scalar threshold and/or a step size) to be used for each iteration. The actor-critic architecture learns to reconstruct images across a range of sampling patterns with a reduced number of parameters needing manual control. The architecture is inspired from optimization-based compressed sensing where the operators used for reconstruction are typically fixed, and a few free parameters may be adapted for each application. Similarly, the reconstruction process is separated into an Actor that performs one iteration of a reconstruction algorithm, and a controller that decides a few number of settings for parameters, such as scalar thresholds and step sizes, that can have an impact on the final result.

Figure 11:
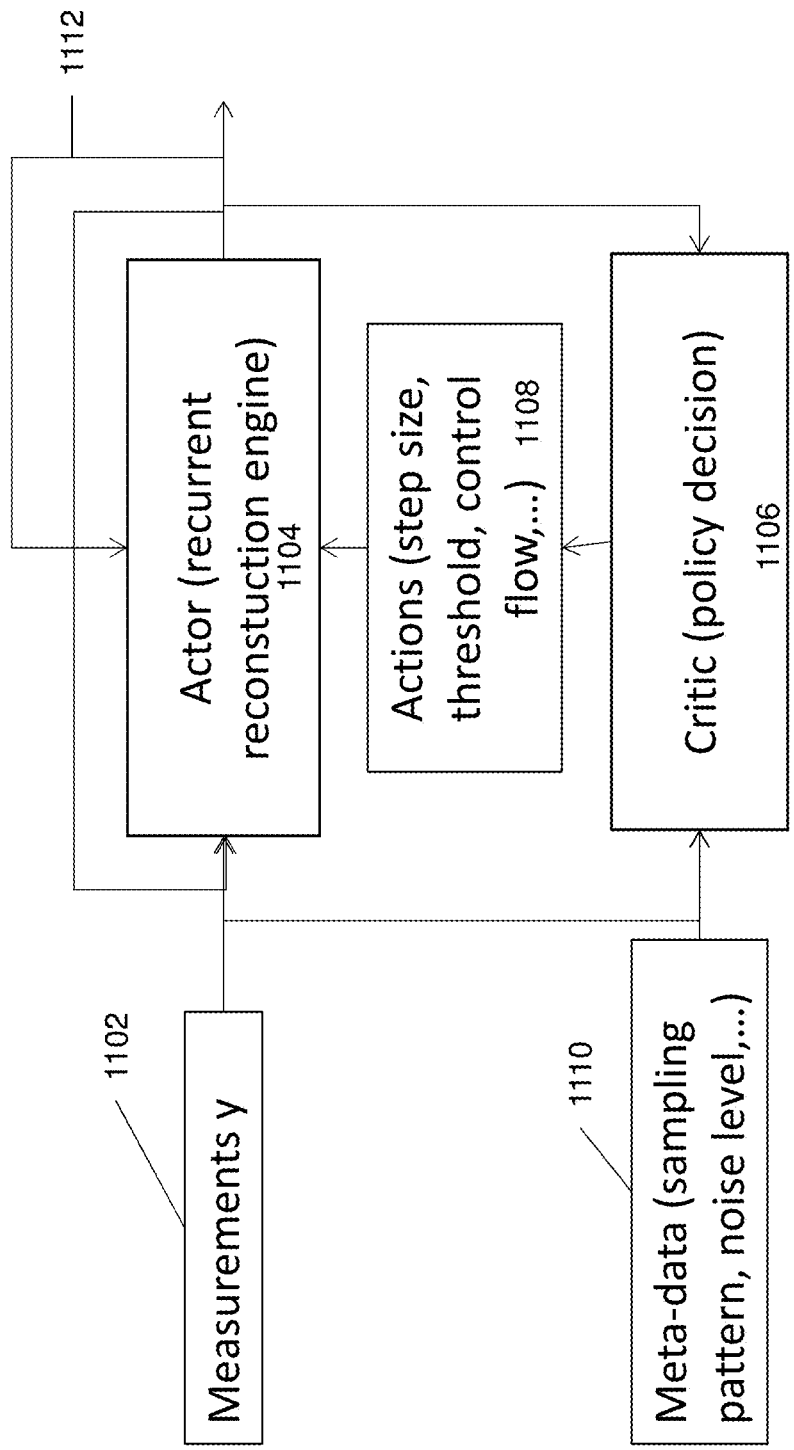
FIG. 11 shows an example actor-critic architecture for deep reinforcement learning.

FIG. 11 shows one embodiment of the actor-critic architecture. The measurements, y, 1102 are the input k-space data, which is under sampled. For reinforcement, meta-data 1110 is also input. The meta-data is one or more measurements of covariance, such as the sampling pattern, noise level, and/or power spectrum. Other meta data may be used, such as any representation of the pulse sequence design (e.g., settings for contrast, a perceptual measure of an image (e.g., perceptual hash), repetition time, echo time, or other input to control operation of the MR scanner). Other meta data may include any calibration measurements, such as a level of cross-talk of coils.

The architecture includes an actor 1104. The actor is the recurrent reconstruction engine. Any iterative reconstruction may be used for the reconstruction engine, such as any reconstruction discussed above for reconstructing from under-sampled image data. The critic 1106 learns a policy. The policy controls decisions for actions 1108 in an action space of the actor 1104. The actor responds to one or more reconstruction parameters to perform a next iteration of the reconstruction. For example, parameters for the threshold, step size of gradient descent, and/or relative contribution of fit data-to-denoising-to-the previous reconstructed image define the action space. Any reconstruction parameter discussed above for FIGS. 2-8 may be used.

The currently output image of the actor 1104 is feed back to the actor 1104 and the critic 1106. The feedback 1112 from the actor 1104 to itself represents the reinforcement for training to provide an optimized or best reconstruction at the end, rather than at a given iteration. The critic 1106 receives the initial measurements 1102 or an initially reconstructed image using a model of the MR scanner, the metadata 1110, and the currently reconstructed image.

Figure 12:
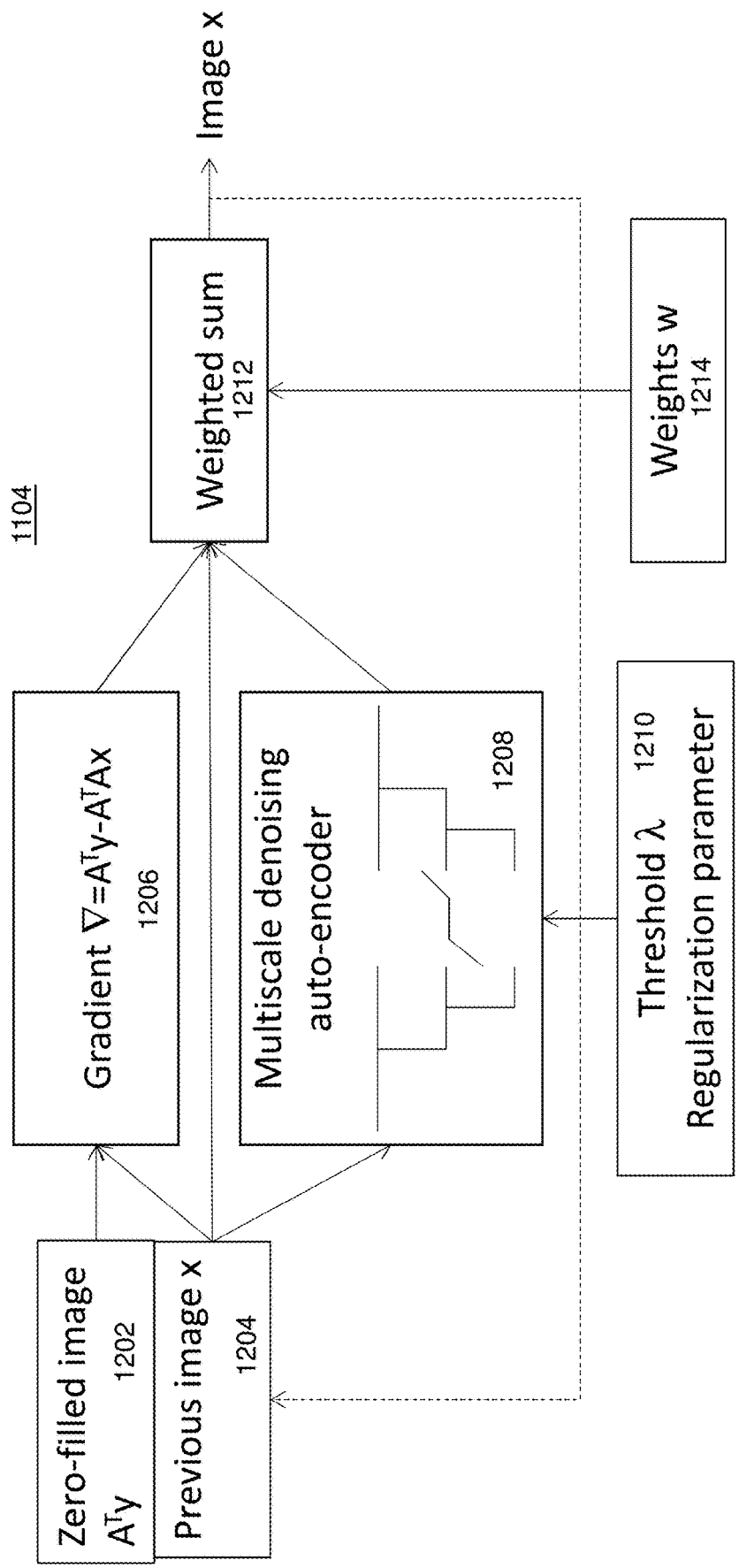
FIG. 12 shows an example recurrent reconstruction engine.

FIG. 12 illustrates one embodiment of the actor 1104. In one embodiment, the actor 1104 is any of the embodiments discussed above for FIGS. 2-8. The actor 1104 implements equation 1 discussed above. The actor 1104 includes a gradient descent operator 1206 for determining a difference or fit of a previous image 1204 to a zero-filled image 1202 generated from a transform of the k-space data. The gradient decent operator 1206 performs the fitting of the data as if fully sampled, as represented by the first part of equation 1. The actor 1104 also includes a multi-scale denoising auto-encoder 1208. The auto-encoder 1208 is a neural network trained to control regularization. Regularization performs denoising of the aliasing artifacts due to the under sampling and is represented by the second part of equation 1. The machine learning trains the auto-encoder 1208 to provide the threshold 1201 (e.g., regularization parameter) for a given sample pattern or mask. An expectation minimization or other approach to training, as discussed above, may be used.

In the example of FIG. 12, the current image x is formed from a weighted sum 1212 using weights 1214 of the gradient, the previous image 1204, and denoising. The weights 1214 (e.g., momentum) may be another parameter set based on the machine learning. Any of the parameters V (for reconstruction), including the trainable parameters discussed above for reconstruction (e.g., step size α, threshold σ, decomposition operator D, reconstruction operator R) may be learned.

In other embodiments, a sequential rather than parallel arrangement of the gradient operator 1206, previous image 1204, and/or denoising auto-encoder 1208 may be used. Different arrangements may be used for different sample patterns, so the arrangement is another parameter that may be learned. In other embodiments, the arrangement is fixed or does not vary by sample pattern.

Figure 13:
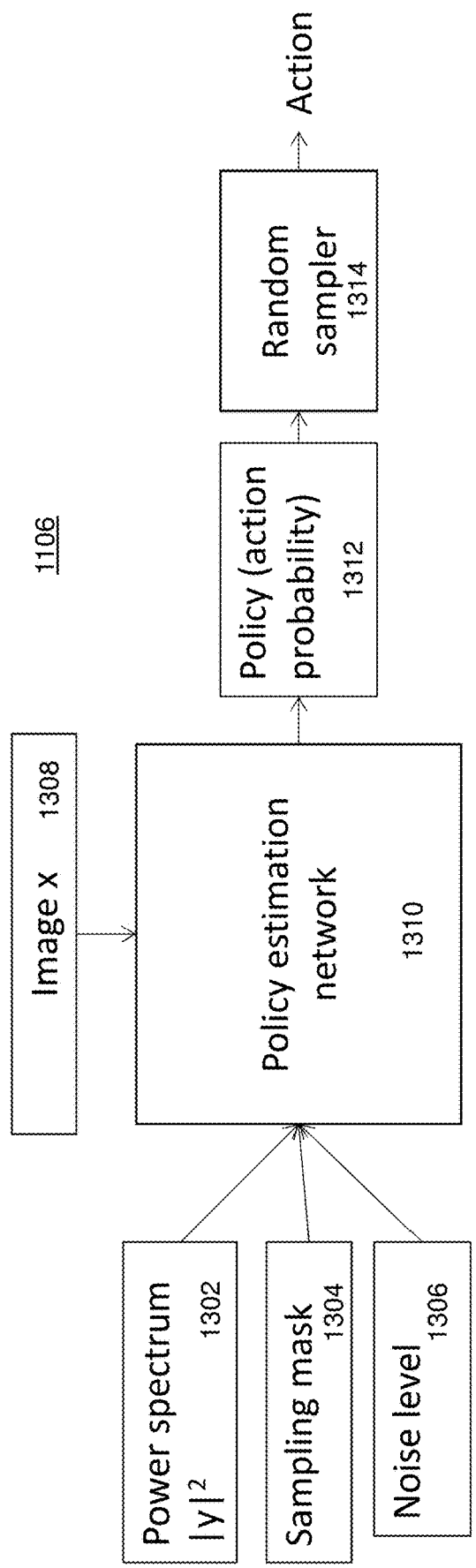
FIG. 13 shows an example critic for deep reinforcement learning.

FIG. 13 illustrates one embodiment of the critic 1106. The critic 1106 is trained to control the reconstruction through multiple iterations. A sequence of actions may add missing sample values to the under sampled image data through denoising. A sequence of actions may control iteration of the reconstruction. The critic 1106 learns to predict a next action or change to make in a next iteration of the reconstruction.

The next action relates to the denoising, but may alternatively or additionally relate to the fitting, weights, and/or other characteristic or parameter of the actor 1104.

The inputs include any metrics (meta data), such as the covariance measures of power spectrum 1302, sampling mask 1304, and/or noise level 1306. The previous or current image 1308 is also input to the policy estimation network 1310. The inputs are not only the current image 1308, but also one or more meta-data that are relevant to evaluating the covariance of the aliasing artifacts, calibration, and/or sequence design or other aspects of the scanning.

The policy estimation network 1310 is a neural network trained to output a probability distribution 1312 for a next action to take given the inputs. The policy estimation network 1310 learns a Markov decision process as a policy of actions over multiple iterations of the MR reconstruction. The Markov decision process is trained to maximize the sum of the rewards received at every iteration. Using the rewards, the sequence of actions over iterations that result in an optimized reconstruction from under sampled image data is learnt. The sequence of actions allows for different sample masks, responding with different actions given different sample masks. The policy estimation network 1310 learns a policy for actions over multiple iterations of the MR reconstruction. The policy uses a current reconstruction and one or more metrics, such as metrics of covariance of aliasing artifacts of a current iteration, to decide the next action for a next iteration.

The policy estimation network 1310 is trained to operate in a given action space defined by the actor 1104. For compressed sensing, the action space may be the denoising, such as any regularization parameter. The policy learns variation of parameters of denoising or reconstruction (e.g., threshold shape, gradient step size, and/or relative weighting) through iterations of the reconstruction from compressed sensing. The probability of a given change from one iteration to another iteration of reconstruction resulting in an action in a sequence of actions to provide an optimized reconstructed image is learned. The probability distributions 1312 from the different possible changes in the action space are used with a random sampler 1314, such as a probability weighted sampler, to determine an action for a next iteration. The reinforcement learning determines the probability distributions given the variations in reconstruction input, including sample mask, resulting in optimization of the reconstruction.

The actor 1104 and the critic 1106 are learnt by policy gradient optimization. The actor-critic architecture is trained with deep reinforcement learning. A reward is earned after each iteration to maximize a sum of the rewards over time with the critic network 1310 learning a heuristic to guess future rewards at any given time. Other optimization may be used. The training maximizes the sum of rewards over time for all data. The training may be expressed as:

$$\max_\theta E_{x_0}(\Sigma_{t=1}^\infty \gamma^t R(t,x_0,y,\theta), 0<\gamma<1,$$

where E is the expectation, $\theta$ is the trainable parameters (e.g., threshold, filterbanks, . . . ) for which actions are available, $x_0$ are the ground truth images, t is an iteration count in reconstruction, y is the k-space data, R is the reward, and $\gamma$ is a discount factor that increases the weight of rewards obtained in early iterations.

Any reward may be used. For example, if the final goal of the reconstruction is to minimize a distance D between the ground truth x0 and the reconstructed image, then the reward may be the decay of that distance, such as represented by:

$$R(t,x_0,y,\theta)=D(x_0,x(t-1,y,\theta))-D(x_0,x(t,y,\theta)).$$

Other reward functions may be used.

In one embodiment, the reward dampens over iterations. For example, the reward exponentially dampens over time to incentivize fast convergence. Any amount of exponential damping may be used. Linear or non-linear reward changes may be used. The training maximizes the sum of the discounted or dampened rewards over time.

After training, the actor-critic architecture is represented as a matrix or tensors. The learned convolution kernels, weights, connections, and/or layers of the neural network or networks for the actor 1104 and critic 1106 are provided. In addition to the actor 1104, such as trained in the embodiments of FIGS. 2-8, the critic 1106 is also provided in the form of the policy estimation network 1310. The matrix or tensors represent the trained policy estimation network 1310.

In act 1006 of FIG. 10, the machine-learnt neural network resulting from the machine learning is stored. The matrix/tensors and the operators or functional blocks of the actor-critic architecture are saved in memory. The machine-learnt neural network may be stored locally or transferred over a network or by moving the memory to other computers, workstations, and/or MR scanners.

The training uses a variety of sample patterns so that the trained network may adapt to any sample pattern. When applied to MR measurements (e.g., k-space data or MR image data) for a given patient, the machine-learnt neural network provides an optimized reconstructed MR image for whatever sample pattern configuration used to scan the patient. The machine-learnt neural network is stored so that the network may be applied to scans of patients. Many copies may be stored at many different locations, but only one copy per location is needed to deal with many different sample patterns.

Figure 14:
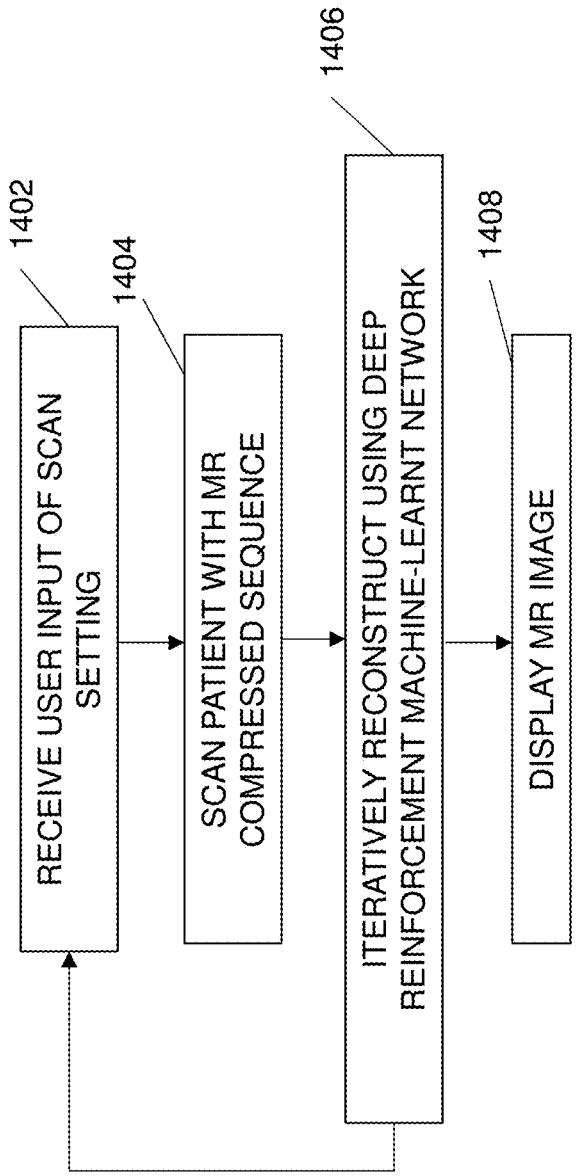
FIG. 14 is a flow chart diagram of an example method for reconstruction in MR compressive sensing.

FIG. 14 illustrates one embodiment of a method for reconstruction of a MR image in an MR system. Images from a range of sampling masks may be reconstructed without the complexity of having to re-train or deploy a different network for each sample mask. The operator configures the MR compressed sensing and other scanning as appropriate for the desired speed, resolution, contrast, and/or other concerns. The resulting sampling mask or pattern to be used due to the configuration is not limited to a sampling mask for which a reconstruction is available. The machine-learnt neural network may reconstruct with any sampling mask. The training allows the network to effectively interpolate between sampling masks. The user may be provided with a continuous range to adjust the acquisition rather than a few presets.

The method is performed by the systems of FIGS. 1, 9, and/or 15 or another system. The MR scanner receives scan settings based on user input of the user interface of the MR scanner and scans the patient. An image processor iteratively reconstructs the MR image using the machine-trained neural network, and a display displays the MR image. Other components may be used, such as a remote server or a workstation performing the reconstruction and/or display.

The method is performed in the order shown or other orders. Additional, different, or fewer acts may be provided. For example, a preset or default settings are used without user input of act 1402.

In act 1402, user input of one or more settings are received. The user input is received through a user interface, such as with a keyboard and mouse or trackball. The user selects a preset or otherwise configures the MR scanner for scanning a particular patient. One or more individual scan parameters may be adjusted or set.

Any scan parameter for MR compressed sensing may be set. For example, the acceleration or other parameter changing the relative speed and image quality is set. The acceleration may be a setting for the type of sampling (e.g., relative number of measures by frequency), spatial density of sampling, or a number of measurements. Settings for contrast, the coil array being used, repetition time, echo time, or other setting establishing the pulse sequence of the MR compressed sensing may be set.

In act 1404, the MR scanner or other MR system scans the patient with the MR compressed sequence. Based on the configuration of the MR scanner, a pulse sequence is created. The pulse sequence is transmitted from coils into the patient. The resulting response of tissue is measured by receiving radio frequency signals at the same or different coils.

The scan is performed with a sample pattern or mask based on the settings. The values of the MR scan parameters result in a given sample pattern. For example, one acceleration setting results in one sample pattern and a different acceleration setting results in a different sample pattern. Since MR compressed sensing is being used, the scan data (e.g., k-space or image data) is under sampled. The amount of under sampling is based on the settings, such as the acceleration.

The under sampling allows for more rapid scanning, but may reduce the image quality resulting from reconstruction. Different sample patterns may have different missing information as compared to a full sampling.

In act 1406, an image processor iteratively reconstructs an MR image from the scan data. Any of various types of reconstruction may be used. The k-space data is Fourier transformed into scalar values representing different spatial locations, such as spatial locations representing a plane through the patient.

The reconstruction is iterative. Since the measurements are under sampled, iterative reconstruction is used to refine the reconstruction to account of the missing measurements. Any number of iterations may be used. Any criterion or criteria may be used to determine a sufficient fit and cease the iterations, such as an $L_2$ norm.

The image processor applies the deep reinforcement machine-learnt network to reconstruct. The actor-critic architecture, as trained, is applied. An initial reconstruction based on a model of the MR scanner generates an initial image. The initial image and any meta data used by the critic are input. For example, the initial image, power spectrum of the k-space data, sample pattern or mask from the scanning, and a calibrated noise level are input. FIG. 11 shows an example. The trained recurrent reconstruction engine 1104 and the trained policy estimation network 1310 with the learned policy receive the input feature vectors (i.e., input data for the particular patient).

The trained recurrent reconstruction engine 1104 is configured by the training to respond to actions 1108 from the critic 1106. For each iteration of the reconstruction, one or more actions representing changes to be made in reconstruction parameters are received. The deep reinforcement machine-learnt network is trained to control the sequence of actions through the iterations based on the learned policy. The policy uses the current image and meta data to determine a change to be made in one or more settings of parameters of reconstruction.

The actions 1108 are determined based on the learned Markov decision process. The current image and meta data are used to determine a probability distribution of settings of a reconstruction parameter. The distribution provides the settings with greater and lesser probabilities of being rewarded to provide optimized reconstruction in a final MR image. The action is determined by random or other sampling of the probability distribution. Probability distributions for more than one reconstruction parameter may be used. The sampling may select which type of action as well as the setting for the action to use. More than one action may be selected, such as altering settings for two or more reconstruction parameters for a given iteration.

The action or actions are for any of the reconstruction parameters. For example, the gradient step size and/or relative contribution of different components (e.g., weights) are the reconstruction parameters corresponding to the action or actions. Alternatively or additionally, one or more reconstruction parameters for denoising due to the under sampled scan data are the reconstruction parameters corresponding to the action or actions. The shape of the threshold or other regularization parameter for controlling aliasing artifacts in the reconstruction are changed. The learned policy determines which of the changes and how much of the determined change to perform in each of the iterations.

For each iteration, the policy determines a next action. The reconstruction is then performed with the reconstruction parameter setting based on the action. Different changes or actions may be made for different iterations. The policy determines the sequence of actions to optimally reconstruct the MR image. The deep reinforcement machine-learnt neural network allows for reconstruction based on any sample pattern or mask in MR compressive sensing.

In act 1408, the image processor outputs a final reconstructed MR image. After the stop criterion shows sufficient or best fit of the reconstructed image to the under sampled scan data, the iterations cease. The last MR image is the optimized MR image.

The output is to a display plane or buffer. Color mapping or other post reconstruction processing is used to generate the MR image. The display device reads from the display plane or buffer to display the image to the operator. In alternative or additional embodiments, the MR image is transferred over a network to other displays, a patient medical record, or memory.

The feedback from act 1406 to act 1402 represents receiving another setting of the acceleration or other scan parameter and repeating the iterative reconstructing with the deep reinforcement machine-learnt network for the other setting. The same deep reinforcement machine-learnt network may be used for different scan settings and corresponding sample patterns. Different patients or the same patient at a different time may be scanned differently while the same trained reconstruction network is used to optimize the reconstruction of the MR image. Other copies of the same deep reinforcement machine-learnt neural network may be used for other patients with the same or different scan settings and corresponding under sampling.

Figure 15:
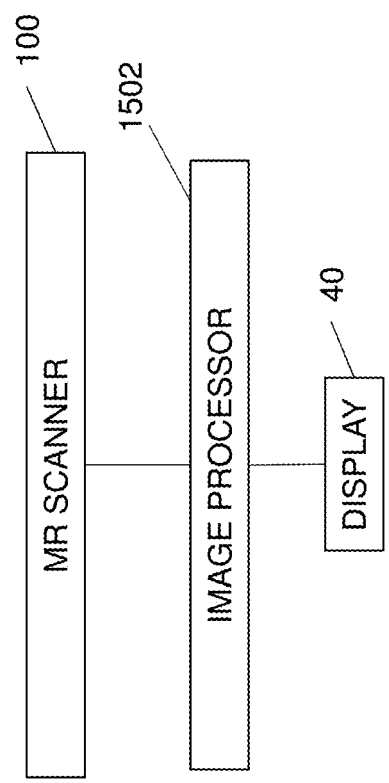
FIG. 15 is a block diagram of one embodiment of a system for use of deep reinforcement for reconstruction in MR compressive sensing.

FIG. 15 illustrates one embodiment of a system for reconstruction in magnetic resonance (MR) compressed sensing. The system includes a MR scanner 100, an image processor 1502, and a display 40. The image processor 1502 and/or the display 40 are part of the MR scanner 100, such as provided in FIG. 1. Alternatively, the image processor 1502 and/or the display 40 are part of a workstation, server, or computer, such as connected through a computer network to the MR scanner 100 and/or as provided in FIG. 9.

The MR scanner 100 is configured to scan a patient with MR compressed sensing. The MR scanner 100 includes controllers, pulse generators, a radio frequency system, and coils for MR scanning.

The user configures the MR scanner 100 to scan the patient, such as selecting one or more settings of scan parameters. The operator interface is used to set a scan parameter. The scan parameter results in a sample pattern. The under sampling is selectable.

The image processor 1502 is a general processor, digital signal processor, three-dimensional data processor, graphics processing unit, application specific integrated circuit, field programmable gate array, digital circuit, analog circuit, combinations thereof, or other now known or later developed device for MR reconstruction. The processor 1502 is a single device, a plurality of devices, or a network. For more than one device, parallel or sequential division of processing may be used. Different devices making up the processor 1502 may perform different functions, such as reconstructing by one device and determining actions for the reconstructing by another device. In one embodiment, the processor 1502 is a control processor or other processor of the MR scanner 100. The processor 1502 operates pursuant to stored instructions to perform various acts described herein. The processor 1502 is configured by hardware, firmware, and/or software The image processor 1502 is configured to iteratively reconstruct an MR image from the scan with a machine-learnt actor-critic network. The actor-critic network includes a policy for a sequence of actions through iterations of the reconstruction. The policy is used to determine the next action in the sequence. The actions are for reconstruction, such as for gradient descent, denoising, and/or relative weighting. For example, the under sampling for the sample pattern based on the setting or settings of the selected parameter or parameters in MR compressed sensing results in initially zero filling and/or aliasing artifacts. The denoising in reconstruction is used to fill data. The shape or other characteristic of the regularization threshold is changed for one or more iterations based on the policy. The policy uses meta data, such as one or more metrics of a covariance of aliasing artifacts. The meta data is provided to the machine-learnt actor-critic network to determine a next action.

The display 40 is a CRT, LCD, plasma, projector, printer, or other display device. The display 40 is configured by loading an image to a display plane or buffer. The display 40 is configured to display the reconstructed MR image.

Computing Environment

FIG. 9 illustrates an exemplary computing environment 900 within which includes an embodiments of the central control system 26 of FIG. 1. For example, computing environment 900 can be used to implement one or more of the deep multi-scale networks described herein. Computers and computing environments, such as central control system 26 and computing environment 900, are known to those of skill in the art and thus are described briefly here.

As shown in FIG. 9, the central control system 26 can include a communication mechanism such as a system bus 921 or other communication mechanism for communicating information within the central control system 26. The central control system 26 further includes one or more processors 920 coupled with the system bus 921 for processing the information.

The processors 920 can include one or more central processing units (CPUs), graphical processing units (GPUs), or any other processor known in the art. More generally, a processor can include a device for executing machine-readable instructions stored on a computer readable medium, for performing tasks and can comprise any one or combination of, hardware and firmware. A processor can also comprise memory storing machine-readable instructions executable for performing tasks. A processor acts upon information by manipulating, analyzing, modifying, converting or transmitting information for use by an executable procedure or an information device, and/or by routing the information to an output device. A processor can use or comprise the capabilities of a computer, controller or microprocessor, for example, and be conditioned using executable instructions to perform special purpose functions not performed by a general purpose computer. A processor can be coupled (electrically and/or as comprising executable components) with any other processor enabling interaction and/or communication there-between. A user interface processor or generator can include electronic circuitry or software or a combination of both for generating display images or portions thereof. A user interface can comprise one or more display images enabling user interaction with a processor or other device.

Continuing with reference to FIG. 9, the central control system 26 also includes a system memory 930 coupled to the system bus 921 for storing information and instructions to be executed by processors 920. The system memory 930 can include computer readable storage media in the form of volatile and/or nonvolatile memory, such as read only memory (ROM) 931 and/or random access memory (RAM) 932. The RAM 932 can include other dynamic storage device(s) (e.g., dynamic RAM, static RAM, and synchronous DRAM). The ROM 931 can include other static storage device(s) (e.g., programmable ROM, erasable PROM, and electrically erasable PROM). In addition, the system memory 930 can be used for storing temporary variables or other intermediate information during the execution of instructions by the processors 920. A basic input/output system 933 (BIOS) containing the basic routines that help to transfer information between elements within central control system 26, such as during start-up, can be stored in the ROM 931. RAM 932 can contain data and/or program modules that are immediately accessible to and/or presently being operated on by the processors 920. System memory 930 can additionally include, for example, operating system 934, application programs 935, other program modules 936 and program data 937.

The central control system 26 can also include a disk controller 940 coupled to the system bus 921 to control one or more storage devices for storing information and instructions, such as a magnetic hard disk 941 and a removable media drive 942 (e.g., floppy disk drive, compact disc drive, tape drive, and/or solid state drive). Storage devices can be added to the central control system 26 using an appropriate device interface (e.g., a small computer system interface (SCSI), integrated device electronics (IDE), Universal Serial Bus (USB), or FireWire).

The central control system 26 can also include a display controller 965 coupled to the system bus 921 to control a display or monitor 966, such as a liquid crystal display (LCD), for displaying information to a computer user. The computer system includes an input interface 960 and one or more input devices, such as a keyboard 962 and a pointing device 961, for interacting with a computer user and providing information to the processors 920. The pointing device 961, for example, can be a mouse, a light pen, a trackball, or a joy stick for communicating direction information and command selections to the processors 920 and for controlling cursor movement on the display 966. The display 966 can provide a touch screen interface which allows input to supplement or replace the communication of direction information and command selections by the pointing device 961.

The central control system 26 can perform a portion or all of the processing steps of embodiments in response to the processors 920 executing one or more sequences of one or more instructions contained in a memory, such as the system memory 930. Such instructions can be read into the system memory 930 from another computer readable medium, such as a magnetic hard disk 941 or a removable media drive 942. The magnetic hard disk 941 can contain one or more data stores and data files used by various embodiments. Data store contents and data files can be encrypted to improve security. The processors 920 can also be employed in a multi-processing arrangement to execute the one or more sequences of instructions contained in system memory 930. In alternative embodiments, hard-wired circuitry can be used in place of or in combination with software instructions. Thus, embodiments are not limited to any specific combination of hardware circuitry and software.

Some embodiments include software instructions written in a high level language, such as C, C++, C#, Java, Fortran or Python. Some embodiments are written for a multi-paradigm numerical computing environment, such as Matlab, sold by Mathworks, Inc. of Natick, Mass., or the like.

As stated above, the central control system 26 can include at least one computer readable medium or memory for holding instructions and for containing data structures, tables, records, or other data described herein. The term "computer readable medium" as used herein refers to any non-transitory machine-readable storage medium that participates in providing instructions to the processors 920 for execution. A computer readable medium can take many forms including, but not limited to, non-transitory, non-volatile media and volatile media. Non-limiting examples of non-volatile media include optical disks, solid state drives, magnetic disks, and magneto-optical disks, such as magnetic hard disk 941 or removable media drive 942. Non-limiting examples of volatile media include dynamic memory, such as dynamic random access memory 930.

The central control system 26 can operate in a networked environment using logical connections to one or more remote computers, such as remote computing device 980. Remote computing device 980 can be a personal computer (laptop or desktop), a mobile device, a server, a router, a network PC, a peer device or other common network node, and typically includes many or all of the elements described above relative to central control system 26. When used in a networking environment, central control system 26 can include modem 972 for establishing communications over a network 971, such as the Internet. Modem 972 can be connected to system bus 921 via user network interface 970, or via another appropriate mechanism.

Network 971 can include, but is not limited to, the Internet, an intranet, a local area network (LAN), a wide area network (WAN), a metropolitan area network (MAN), a personal area network (PAN) a direct connection or series of connections, a cellular telephone network, or any other network or medium capable of facilitating communication between central control system 26 and other computers (e.g., remote computing device 980). The network 971 can be wired, wireless or a combination thereof. Wired connections can be implemented using Ethernet, Universal Serial Bus (USB), RJ-6, or any other wired connection. Wireless connections can be implemented using Wi-Fi, WiMAX, and Bluetooth, infrared, cellular networks, satellite or any other wireless connection methodology. Additionally, several networks can work alone or in communication with each other to facilitate communication in the network 971.

Aside from the computing environment 900 shown in FIG. 9, the methods and systems described herein can be implemented in specialized computing environments. For example, in some embodiments, a plurality of processors can be configured to parallelize at least one of the decomposition operations, the non-linear thresholding, and/or the reconstruction operations performed by the neural networks described above. These processors can be arranged, for example, in a parallel computing platform using technologies such as "Apache Spark™" or "NVIDIA CUDA™".

The functions and process steps described herein can be performed automatically or wholly or partially in response to user command. An activity (including a step) performed automatically is performed in response to one or more executable instructions or device operation without user direct initiation of the activity.

The methods and system described herein can be at least partially embodied in the form of computer-implemented processes and apparatus for practicing those processes. The disclosed methods can also be at least partially embodied in the form of tangible, non-transitory machine readable storage media encoded with computer program code. The media can include, for example, RAMs, ROMs, CD-ROMs, DVD-ROMs, BD-ROMs, hard disk drives, flash memories, or any other non-transitory machine-readable storage medium, wherein, when the computer program code is loaded into and executed by a computer, the computer becomes an apparatus for practicing the method. The methods can also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods can alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which can be made by those skilled in the art.

What is claimed is:

1. A method for reconstruction of a magnetic resonance (MR) image in an MR system, the method comprising:
   receiving a user input of a setting of acceleration in an MR compressed sequence;
   scanning, by the MR system, a patient with the MR compressed sequence resulting in scan data under-sampled by an amount based on the setting of the acceleration;
   iteratively reconstructing, by an image processor, the MR image from the scan data, the reconstructing applying a deep reinforcement machine-learnt network, the deep reinforcement machine-learnt network trained to control a sequence of actions based on a learned policy through the iterations, the actions being changes in parameters of denoising due to the under-sampled scan data; and
   displaying the MR image,
   wherein the learned policy generates an action probability distribution and determines the action for each iteration by sampling the probability distribution.

2. The method of claim 1 wherein receiving the user input comprises receiving the acceleration as an input affecting a type of sampling or a number of measurements.

3. The method of claim 1 wherein scanning comprises scanning with a sample pattern based on the setting of the acceleration.

4. The method of claim 1 wherein iteratively reconstructing comprises reconstructing with the deep reinforcement machine-learnt network comprising an actor-critic architecture with each of the actions being for one of the iterations of the reconstruction.

5. The method of claim 4 wherein an actor of the actor-critic architecture comprises a recurrent reconstruction network and wherein a critic of the actor-critic architecture comprises a policy estimation network of the learned policy.

6. The method of claim 1 wherein iteratively reconstructing comprises reconstructing with the learned policy trained as a Markov decision process based on a sampling mask, power spectrum, and/or noise level.

7. The method of claim 1 wherein iteratively reconstructing comprises reconstructing with the actions comprising changes in gradient descent step size, shape of a threshold, and/or a weight of relative contribution of denoising, a previous image, and a reconstruction to an output image for the iteration.

8. The method of claim 7 wherein the learned policy determines which of the changes and how much of the determined change to perform in each of the iterations.

9. The method of claim 1 further comprising:
receiving another setting of the acceleration and repeating the iteratively reconstructing with the deep reinforcement machine-learnt network for the other setting of the acceleration.

10. A system for reconstruction in magnetic resonance (MR) compressed sensing, the system comprising:
an MR scanner configured to scan a patient with the MR compressed sensing, the scan being with a parameter of the MR compressed sensing for the patient being selectable;
an image processor configured to iteratively reconstruct an MR image from the scan with a machine-learnt actor-critic network including a policy for a sequence of actions through iterations of the reconstruction, the actions being for denoising in the reconstruction due to the selectable parameter of the MR compressed sensing; and
a display configured to display the MR image,
wherein the image processor is configured to determine the sequence with input of one or more metrics of a covariance of aliasing artifacts to the machine-learnt actor-network.

11. The system of claim 10 wherein the parameter comprises an acceleration for the MR compressed sensing.

* * * * *